(12) United States Patent
Endo et al.

(10) Patent No.: US 9,577,108 B2
(45) Date of Patent: Feb. 21, 2017

(54) SEMICONDUCTOR DEVICE

(71) Applicant: Semiconductor Energy Laboratory Co., Ltd., Atsugi-shi, Kanagawa-ken (JP)

(72) Inventors: Yuta Endo, Atsugi (JP); Toshinari Sasaki, Atsugi (JP); Kosei Noda, Atsugi (JP); Mizuho Sato, Kawasaki (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 59 days.

(21) Appl. No.: 14/281,031

(22) Filed: May 19, 2014

(65) Prior Publication Data
US 2014/0252347 A1    Sep. 11, 2014

Related U.S. Application Data

(63) Continuation of application No. 13/110,245, filed on May 18, 2011, now abandoned.

(30) Foreign Application Priority Data

May 21, 2010    (JP) .................. 2010-117743

(51) Int. Cl.
  H01L 21/02    (2006.01)
  H01L 29/786   (2006.01)
  H01L 27/12    (2006.01)

(52) U.S. Cl.
  CPC ..... *H01L 29/7869* (2013.01); *H01L 29/78603* (2013.01); *H01L 29/78606* (2013.01); *H01L 27/1225* (2013.01)

(58) Field of Classification Search
  CPC .................. H01L 21/02565; H01L 21/02631
  See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Singh et al., "Effect of substrate temperature on the structure and optical properties of ZnO thin films deposited by reactive RF magnetron sputtering," Thin Solid Films, vol. 515, Issue 24, Oct. 15, 2007, pp. 8718-8722, ISSN 0040-6090; doi:10.1016/j.tsf.2007.03.168.*

(Continued)

*Primary Examiner* — Peniel M Gumedzoe
*Assistant Examiner* — Christopher Johnson
(74) *Attorney, Agent, or Firm* — Robinson Intellectial Property Law Office; Eric J. Robinson

(57) ABSTRACT

Disclosed is a semiconductor device with a transistor in which an oxide semiconductor is used. An insulating layer on a back channel side of the oxide semiconductor layer has capacitance of lower than or equal to $2 \times 10^{-4}$ F/m². For example, in the case of a top-gate transistor, a base insulating layer has capacitance of lower than or equal to $2 \times 10^{-4}$ F/m², whereby the adverse effect of an interface state between the substrate and the base insulating layer can be reduced. Thus, a semiconductor device where fluctuation in electrical characteristics is small and reliability is high can be manufactured.

12 Claims, 16 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,393,761 B2 | 7/2008 | Wajda et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,651,896 B2 | 1/2010 | Honda et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,977,168 B2 | 7/2011 | Honda et al. |
| 8,049,225 B2 | 11/2011 | Yamazaki et al. |
| 8,207,014 B2 | 6/2012 | Sasaki et al. |
| 8,384,077 B2 | 2/2013 | Yano et al. |
| 8,389,326 B2 | 3/2013 | Sasaki et al. |
| 8,497,502 B2 | 7/2013 | Yaegashi |
| 8,502,217 B2 | 8/2013 | Sato et al. |
| 8,623,698 B2 | 1/2014 | Sasaki et al. |
| 8,785,242 B2 | 7/2014 | Yamazaki et al. |
| 8,981,369 B2 | 3/2015 | Yano et al. |
| 9,054,137 B2 | 6/2015 | Sasaki et al. |
| 9,105,659 B2 | 8/2015 | Yamazaki et al. |
| 9,136,115 B2 | 9/2015 | Sasaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0270175 A1 | 11/2006 | Aoki et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0057618 A1 | 3/2008 | Honda et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278120 A1* | 11/2009 | Lee .................. H01L 29/4908 257/43 |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0032668 A1 | 2/2010 | Yamazaki et al. |
| 2010/0051940 A1 | 3/2010 | Yamazaki et al. |
| 2010/0051949 A1 | 3/2010 | Yamazaki et al. |
| 2010/0059747 A1 | 3/2010 | Nakayama et al. |
| 2010/0065844 A1 | 3/2010 | Tokunaga |
| 2010/0092800 A1 | 4/2010 | Itagaki et al. |
| 2010/0102312 A1 | 4/2010 | Yamazaki et al. |
| 2010/0109002 A1 | 5/2010 | Itagaki et al. |
| 2010/0184254 A1 | 7/2010 | Honda et al. |
| 2010/0295041 A1 | 11/2010 | Kumomi et al. |
| 2010/0304528 A1 | 12/2010 | Kim et al. |
| 2011/0006301 A1 | 1/2011 | Yamazaki et al. |
| 2011/0008930 A1* | 1/2011 | Sasaki .................. H01L 29/7869 438/104 |
| 2011/0198586 A1 | 8/2011 | Inoue et al. |
| 2011/0284844 A1 | 11/2011 | Endo et al. |
| 2011/0284845 A1 | 11/2011 | Endo et al. |
| 2011/0284846 A1 | 11/2011 | Endo et al. |
| 2011/0303913 A1 | 12/2011 | Yamazaki et al. |
| 2012/0122277 A1 | 5/2012 | Yamazaki et al. |
| 2012/0187399 A1 | 7/2012 | Fukuda et al. |
| 2013/0009111 A1 | 1/2013 | Morita et al. |

FOREIGN PATENT DOCUMENTS

| | | |
|---|---|---|
| JP | 56-116627 A | 9/1981 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-105951 A | 4/1997 |
| JP | 11-505377 | 5/1999 |
| JP | 2000-044236 A | 2/2000 |
| JP | 2000-150900 A | 5/2000 |
| JP | 2000-275678 A | 10/2000 |
| JP | 2002-076356 A | 3/2002 |
| JP | 2002-289859 A | 10/2002 |

(56) References Cited

FOREIGN PATENT DOCUMENTS

| | | |
|---|---|---|
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-319673 A | 11/2004 |
| JP | 2005-033172 A | 2/2005 |
| JP | 2006-165528 A | 6/2006 |
| JP | 2006-324368 A | 11/2006 |
| JP | 2007-250982 A | 9/2007 |
| JP | 2008-085312 A | 4/2008 |
| JP | 2008-532262 | 8/2008 |
| JP | 2008-277665 A | 11/2008 |
| JP | 2009-016469 A | 1/2009 |
| JP | 2009-065012 A | 3/2009 |
| JP | 2009-141002 A | 6/2009 |
| JP | 2009-275272 A | 11/2009 |
| JP | 2010-034534 A | 2/2010 |
| JP | 2010-062547 A | 3/2010 |
| JP | 2010-067849 A | 3/2010 |
| JP | 2010-073733 A | 4/2010 |
| JP | 2010-080947 A | 4/2010 |
| JP | 2010-080952 A | 4/2010 |
| JP | 2010-087303 A | 4/2010 |
| JP | 2010-103340 A | 5/2010 |
| JP | 2011-097007 A | 5/2011 |
| JP | 2011-199192 A | 10/2011 |
| JP | 2012-124446 A | 6/2012 |
| KR | 2008-0020569 A | 3/2008 |
| KR | 2010-0019357 A | 2/2010 |
| TW | 201013934 | 4/2010 |
| WO | WO-2004/114391 | 12/2004 |
| WO | WO-2006/083380 | 8/2006 |
| WO | WO-2009/072532 | 6/2009 |
| WO | WO-2009/075281 | 6/2009 |

OTHER PUBLICATIONS

Bae et al., "The effect of annealing on amorphous indium gallium zinc oxide thin film transistors," Thin Solid Films, vol. 518, Issue 22, Sep. 1, 2010, pp. 6325-6329, ISSN 0040-6090, http://dx.doi.org/10.1016/j.tsf.2010.02.073.*

Kikuchi et al., "Device characteristics improvement of a-In—Ga—Zn—O TFTs by low-temperature annealing," Thin Solid Films, vol. 518, Issue 11, Mar. 31, 2010, pp. 3017-3021, ISSN 0040-6090, http://dx.doi.org/10.1016/j.tsf.2009.10.132.*

Toyoda, EPO translation of JP 2009016469, dated Jan. 22, 2009.*

International Search Report (Application No. PCT/JP2011/061351) Dated Aug. 16, 2011.

Written Opinion (Application No. PCT/JP2011/061351) Dated Aug. 16, 2011.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2057-2059.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

(56) References Cited

OTHER PUBLICATIONS

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digset of Technical Papers, May 31, 2009, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al.; "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M at al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M at al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Oh.M et al., "Improving the Gate Stability of ZnO Thin-Film Transistors With Aluminum Oxide Dielectric Layers", J.

(56) References Cited

OTHER PUBLICATIONS

Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Bugg.D, "3.1 Charge and Capacitance", Electronics:Circuits,Amplifiers and Gates, p. 47, IOP Publishing (Institute of Physics Publishing Bristol and Philadelphia).
Groner.M et al., "Electrical characterization of thin Al2O3 films grown by atomic layer deposition on silicon and various metal substrates", Thin Solid Films, Jun. 24, 2002, vol. 413, No. 1-2, 186-197, Elsevier.
Taiwanese Office Action (Application No. 100117579) Dated Jul. 14, 2015.

\* cited by examiner

SEMICONDUCTOR DEVICE

TECHNICAL FIELD

The present invention relates to a semiconductor device

In this specification, a semiconductor device means a general device which can function by utilizing semiconductor characteristics, and an electrooptic device, a semiconductor circuit, and an electronic device are all semiconductor devices.

BACKGROUND ART

A technique by which transistors are formed using semiconductor thin films formed over a substrate having an insulating surface has been attracting attention. Such transistors are applied to a wide range of electronic devices such as an integrated circuit (IC) and an image display device (display device). As semiconductor thin films applicable to the transistors, silicon-based semiconductor materials have been widely used, but oxide semiconductors have been attracting attention as alternative materials.

For example, disclosed is a transistor whose active layer is formed using an amorphous oxide containing indium (In), gallium (Ga), and zinc (Zn) and having an electron carrier concentration of lower than $10^{18}/cm^3$ (see Patent Document 1).

A transistor including an oxide semiconductor is known to have a problem of low reliability because of high possibility of fluctuation in electrical characteristics, although the transistor including an oxide semiconductor can be operated at higher speed than a transistor including amorphous silicon and can be manufactured more easily than a transistor including polycrystalline silicon. For example, the threshold voltage of the transistor fluctuates between before and after a bias-temperature stress test (BT test). Note that in this specification, a "threshold voltage" refers to a gate voltage which is needed to turn on a transistor. "Gate voltage" refers to a potential difference between a source electrode and a gate electrode when the potential of the source electrode is used as a reference potential.

REFERENCE

[Patent Document 1] Japanese Published Patent Application No. 2006-165528

DISCLOSURE OF INVENTION

Fluctuation in the threshold voltage due to a BT test of the transistor including an oxide semiconductor reduces the reliability of the transistor including an oxide semiconductor. Therefore, an object of one embodiment of the present invention is to improve the reliability of a semiconductor device including an oxide semiconductor.

One embodiment of the present invention is a semiconductor device or a manufacturing method thereof based on the following technical idea: an insulating layer having a sufficient thickness is formed as an insulating layer which faces a gate insulating layer with an oxide semiconductor layer interposed therebetween and at least part of which is in contact with the oxide semiconductor layer, in a transistor including an oxide semiconductor.

An "insulating layer having a sufficient thickness" is, specifically, referred to as an insulating layer having a thickness in which capacitance per unit area is lower than or equal to $2\times10^{-4}$ F/m$^2$, preferably lower than or equal to $1.5\times10^{-4}$ F/m$^2$ by capacitance.

Another embodiment of the present invention is a semiconductor device or a manufacturing method thereof based on the following technical idea: an insulating layer having a sufficient thickness is formed as a base insulating layer in a top-gate transistor including an oxide semiconductor.

By providing the base insulating layer having a sufficient thickness, capacitance per unit area becomes lower than or equal to $2\times10^{-4}$ F/m$^2$ by capacitance; thus, it is possible to suppress the adverse effect of trapping of charge or the like, which can be generated due to the operation of a semiconductor device, or the like, at an interface between a substrate and the base insulating layer. This advantageous effect is attributed to an increase in physical distance between the oxide semiconductor layer and the interface between the substrate and the base insulating layer.

Since the above adverse effect of trapping of charge at the interface between the substrate and the base insulating layer can be suppressed, malfunctions such as fluctuation in threshold voltage in a BT test performed on the transistor including an oxide semiconductor can be suppressed and the reliability of the semiconductor device can be increased.

Another embodiment of the present invention is a semiconductor device including a substrate, a base insulating layer, an oxide semiconductor layer over the base insulating layer, a source electrode and a drain electrode which are electrically connected to the oxide semiconductor layer, a gate insulating layer part of which is in contact with the oxide semiconductor layer, and a gate electrode over the gate insulating layer. The base insulating layer has a sufficient thickness.

In the above structure, the base insulating layer can be a single layer or a stacked layer formed using one or more of silicon oxide, silicon oxynitride, silicon nitride oxide, and aluminum oxide. The gate insulating layer can be a single layer or a stacked layer formed using one or more of silicon oxide, aluminum oxide, and hafnium oxide. In terms of a reduction of the adverse effect of charge at an interface between the substrate and the base insulating layer, the base insulating layer is preferably formed using a material having a low dielectric constant.

In this specification, silicon oxynitride refers to a substance that contains more oxygen than nitrogen and for example, silicon oxynitride includes oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0 atomic % and less than or equal to 10 atomic %, respectively. Further, silicon nitride oxide refers to a substance that contains more nitrogen than oxygen and for example, silicon nitride oxide includes oxygen, nitrogen, silicon, and hydrogen at concentrations ranging from greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 25 atomic %, respectively. Note that rates of oxygen, nitrogen, silicon, and hydrogen fall within the above ranges in the cases where measurement is performed using Rutherford backscattering spectrometry (RBS) or hydrogen forward scattering spectrometry (HFS). In addition, the total of the percentages of the constituent elements does not exceed 100 atomic %.

In the above structure, a protective insulating layer which covers the gate insulating layer and the gate electrode may be provided. A conductive layer which serves as a back gate electrode may be provided below the oxide semiconductor layer.

Another embodiment of the present invention is a semiconductor device or a method thereof based on the following technical idea: an insulating layer having a sufficient thickness is formed as a protective insulating layer in a bottom-gate transistor including an oxide semiconductor.

By providing a protective insulating layer having a sufficient thickness, it is possible to suppress the above adverse effect of trapping of charge or the like, which can be generated due to the operation of a semiconductor device, or the like, at a surface of the protective insulating layer. This advantageous effect is attributed to an increase in physical distance between the surface of the protective insulating layer and an oxide semiconductor layer.

As described above, the advantageous effect according to one embodiment of the present invention is attributed to the protective insulating layer having a sufficient thickness.

Since trapping of charge at the surface of the protective insulating layer can be suppressed, malfunctions such as fluctuation in threshold voltage in a BT test performed on the transistor including an oxide semiconductor can be suppressed and the reliability of the semiconductor device can be increased.

Another embodiment of the present invention is a semiconductor device including a base insulating layer; a gate electrode over the base insulating layer; a gate insulating layer over the gate electrode; an oxide semiconductor layer over the gate electrode with the gate insulating layer interposed therebetween; a source electrode and a drain electrode which are electrically connected to the oxide semiconductor layer; and a protective insulating layer over the source electrode and the drain electrode, part of which is in contact with the oxide semiconductor layer. The protective insulating layer has a sufficient thickness.

In the above structure, the protective insulating layer can be a single layer or a stacked layer formed using one or more of silicon oxide, silicon oxynitride, silicon nitride oxide, and aluminum oxide. The gate insulating layer can be a single layer or a stacked layer formed using one or more of silicon oxide, aluminum oxide, and hafnium oxide. In terms of a reduction of the adverse effect of charge at the surface of the protective insulating layer, the protective insulating layer is preferably formed using a material having a low dielectric constant.

In the above structure, a conductive layer which serves as a back gate electrode may be provided above the oxide semiconductor layer.

In the above, the channel length L of the transistor, which depends on the distance between the source electrode and the drain electrode, can be greater than or equal to 10 nm and less than or equal to 10 μm, for example, 0.1 μm to 0.5 μm. It is needless to say that the channel length L may be greater than or equal to 1 μm. The channel width W may be greater than or equal to 10 μm.

According to one embodiment of the present invention, a transistor which has a small off-state current, small variation in the threshold voltage, and stable electrical characteristics can be provided.

Alternatively, according to one embodiment of the present invention, a semiconductor device which includes a transistor having favorable electrical characteristics and high reliability can be provided.

BEST MODE FOR CARRYING OUT THE INVENTION

Figure 1A:
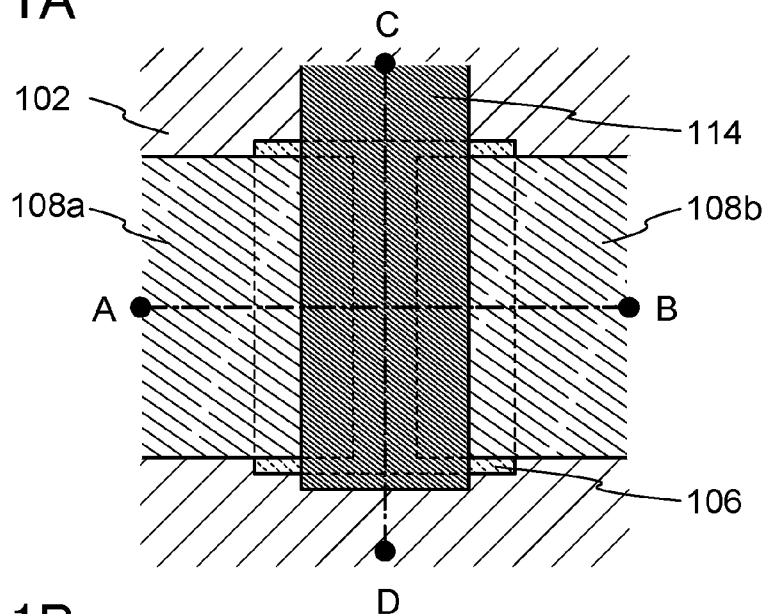
FIGS. 1A to 1C are a top view and cross-sectional views illustrating an example of a semiconductor device according to one embodiment of the present invention.

Hereinafter, embodiments of the present invention will be described in detail with reference to the drawings. Note that the present invention is not limited to the following description, and it will be easily understood by those skilled in the art that modes and details disclosed herein can be modified in various ways without departing from the spirit and the scope of the present invention. Thus, the present invention should not be construed as being limited to the following description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, one embodiment of a semiconductor device and a manufacturing method thereof will be described with reference to FIGS. 1A to 1C, FIGS. 2A to 2D, FIGS. 3A to 3E, FIGS. 4A to 4E, FIGS. 5A to 5E, FIGS. 6A to 6E, and FIGS. 7A to 7E.

Figure 1B:
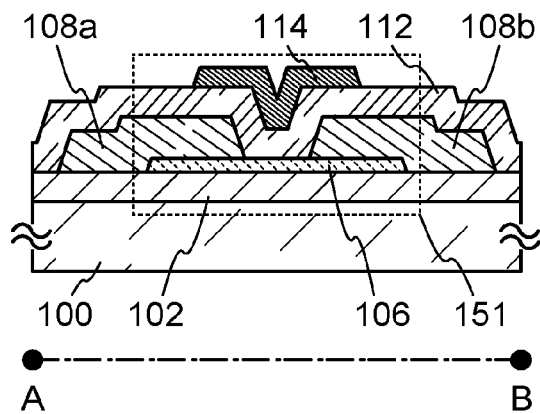
Figure 1C:
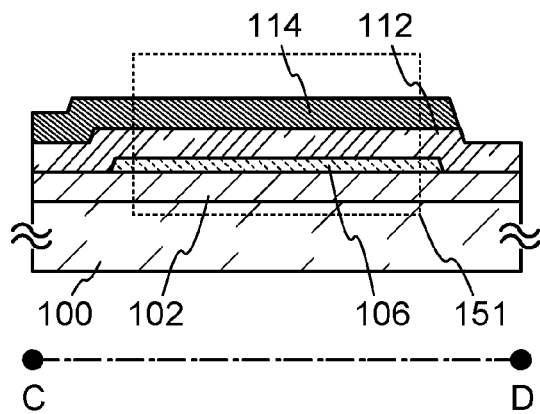

FIGS. 1A to 1C are a top view and cross-sectional views of a transistor 151 which is a top-gate top-contact type as an example of a semiconductor device according to one embodiment of the present invention. Here, FIG. 1A is a top view, FIG. 1B is a cross-sectional view along A-B of FIG. 1A, and FIG. 1C is a cross-sectional view along C-D of FIG. 1A. Note that in FIG. 1A, some of components of the transistor 151 (for example, a gate insulating layer 112) are omitted for brevity.

The transistor 151 in FIGS. 1A to 1C includes a base insulating layer 102, an oxide semiconductor layer 106, a source electrode 108a, a drain electrode 108b, the gate insulating layer 112, and a gate electrode 114 over a substrate 100.

Figure 16:
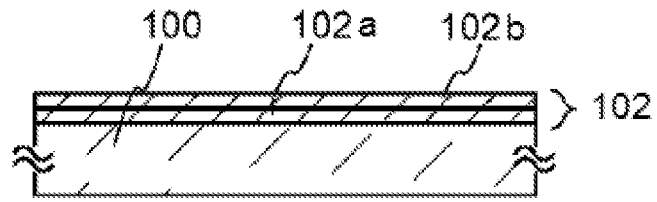
FIG. 16 is a cross-sectional view illustrating an example of a manufacturing process in which stacked insulating layers are formed.

As a material of the base insulating layer 102, silicon oxide, silicon oxynitride, or the like may be used. Alternatively, the base insulating layer 102 may be formed using a stacked layer of the above material and silicon nitride, silicon nitride oxide, aluminum oxide, aluminum nitride, a mixed material of any of them, or the like (see, e.g., FIG. 16 showing base insulating layer 102 formed from a stack of layers 102a and 102b). For example, when the base insulating layer 102 has a stacked-layer structure of a silicon nitride layer, a silicon nitride oxide layer, an aluminum oxide layer, or an aluminum nitride layer, and a silicon oxide layer, entry of moisture from the substrate 100 or the like to the transistor 151 can be prevented. In the case where the base insulating layer 102 is formed to have a stacked-layer structure, an oxide layer of silicon oxide, silicon oxynitride, or the like is preferably formed on a side where the base insulating layer 102 is in contact with the oxide semiconductor layer 106. Note that the base insulating layer 102 functions as a base layer of the transistor 151. Note that the base insulating layer 102 has a sufficient thickness. An "insulating layer having a sufficient thickness" is referred to as an insulating layer having a thickness in which capacitance per unit area is lower than or equal to $2\times10^{-4}$ F/m$^2$ by capacitance.

As a material used for the oxide semiconductor layer, a four-component metal oxide material such as an In—Sn—Ga—Zn—O-based material; a three-component metal oxide material such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide material such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an one component metal oxide material such as an In—O-based material; a Sn—O-based material; a Zn—O-based material; or the like can be used. In addition, any of the above materials may contain SiO$_2$. Here, for example, an In—Ga—Zn—O-based material means an oxide layer containing indium (In), gallium (Ga), and zinc (Zn), and there is no particular limitation on the composition ratio thereof. Further, the In—Ga—Zn—O-based material may contain an element other than In, Ga, and Zn. As an example, in the case where an In—Zn—O-based material is used, any of the following is employed: In/Zn is greater than or equal to 0.5 and less than or equal to 50 in an atomic ratio, preferably In/Zn is greater than or equal to 1 and less than or equal to 20 in an atomic ratio, or more preferably In/Zn is greater than or equal to 1.5 and less than or equal to 15 in an atomic ratio. When the atomic ratio of Zn is in the above range, the field effect mobility of the transistor can be improved. Here, when the atomic ratio of the compound is In:Zn:O=X:Y:Z, the relation of Z>1.5X+Y is preferably satisfied.

For the oxide semiconductor layer, a thin film using a material represented by the chemical formula, InMO$_3$(ZnO)$_m$ (m>0), can be used. Here, M represents one or more metal elements selected from Ga, Al, Mn, and Co. For example, M can be Ga, Ga and Al, Ga and Mn, Ga and Co, or the like.

The gate insulating layer 112 can have a structure similar to that of the base insulating layer 102. Note that a material having a high dielectric constant, such as hafnium oxide or aluminum oxide, may be used for the gate insulating layer 112 considering the function of the gate insulating layer of the transistor. Alternatively, a stacked layer of silicon oxide, silicon oxynitride, or silicon nitride and a material having a high dielectric constant, such as hafnium oxide or aluminum oxide, may be used considering a gate withstand voltage and a condition of an interface between the oxide semiconductor layer and the gate insulating layer 112.

A protective insulating layer may further be provided over the transistor 151. The protective insulating layer can have a structure similar to that of the base insulating layer 102. In order to electrically connect the source electrode 108a or the drain electrode 108b and a wiring, an opening may be formed in the base insulating layer 102, the gate insulating layer 112, and the like. A second gate electrode may further be provided below the oxide semiconductor layer 106. Note that it is not always necessary but preferable to process the oxide semiconductor layer 106 into an island shape.

FIGS. 2A to 2D illustrate cross-sectional structures of transistors having different structures from that of the transistor 151.

Figure 2A:
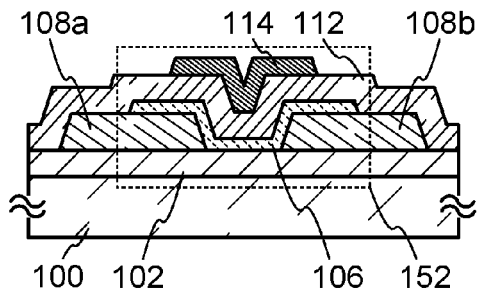
FIGS. 2A to 2D are cross-sectional views each illustrating an example of a semiconductor device according to one embodiment of the present invention.

A transistor 152 in FIG. 2A is the same as the transistor 151 in that it includes the base insulating layer 102, the oxide semiconductor layer 106, the source electrode 108a, the drain electrode 108b, the gate insulating layer 112, and the gate electrode 114. The differences between the transistor 152 and the transistor 151 are the positions where the oxide semiconductor layer 106 is connected to the source electrode 108a and the drain electrode 108b. That is, in the transistor 152, the source electrode 108a and the drain electrode 108b are in contact with bottom portions of the oxide semiconductor layer 106. The other components are similar to those of the transistor 151 in FIGS. 1A to 1C.

Figure 2B:
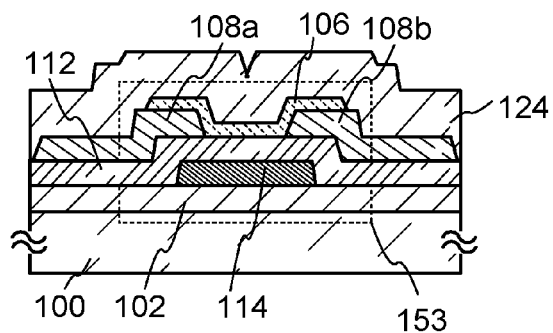

The transistor 153 in FIG. 2B is the same as the transistor 152 in that it includes the base insulating layer 102, the oxide semiconductor layer 106, the source electrode 108a, the drain electrode 108b, the gate insulating layer 112, and the gate electrode 114. A difference between the transistor 153 and the transistor 152 is a position of the gate electrode with respect to the oxide semiconductor layer 106. In other words, in the transistor 153, the gate electrode is provided below the oxide semiconductor layer 106 with the gate insulating layer 112 interposed therebetween. Further, in the transistor 153, a protective insulating layer 124 is provided to cover the source electrode 108a, the drain electrode 108b, and the oxide semiconductor layer 106. The other components are the same as those of the transistor 152 in FIG. 2A.

Figure 2C:
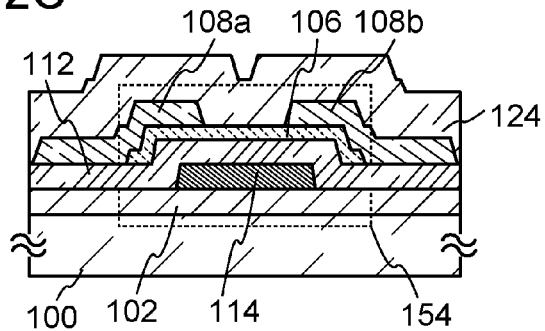

The transistor 154 in FIG. 2C is the same as the transistor 151 in that it includes the base insulating layer 102, the oxide semiconductor layer 106, the source electrode 108a, the drain electrode 108b, the gate insulating layer 112, and the gate electrode 114. A difference between the transistor 154 and the transistor 151 is a position of the gate electrode with respect to the oxide semiconductor layer 106. In other words, in the transistor 154, the gate electrode is provided below the oxide semiconductor layer 106 with the gate insulating layer 112 interposed therebetween. Further, in the transistor 154, the protective insulating layer 124 is provided to cover the source electrode 108a, the drain electrode 108b, and the oxide semiconductor layer 106. The other components are the same as those of the transistor 151 in FIGS. 1A to 1C.

Figure 2D:
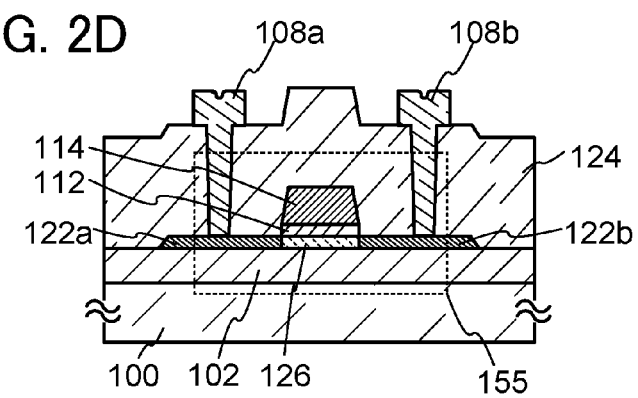

The transistor 155 in FIG. 2D is the same as the transistor 151 and the transistor 152 in that it includes the base insulating layer 102, the gate insulating layer 112, the gate electrode 114, the source electrode 108a, and the drain electrode 108b. The transistor 155 is different from the transistor 151 and the transistor 152 in that a channel region 126, a source region 122a, and a drain region 122b are formed in the oxide semiconductor layer in the same plane. The source region 122a and the drain region 122b are connected to the source electrode 108a and the drain electrode 108b, respectively, with a protective insulating layer 124 interposed therebetween. Note that in FIG. 2D, the gate insulating layer 112 is provided only under the gate electrode 114; however, one embodiment of the present invention is not limited thereto. For example, the gate insulating layer 112 may be provided to cover the oxide semiconductor layer including the channel region 126, the source region 122a, and the drain region 122b.

Examples of a manufacturing process of the transistor in FIGS. 1A to 1C will be described below with reference to FIGS. 3A to 3E and FIGS. 4A to 4E.

To begin with, an example of a manufacturing process of the transistor 151 in FIGS. 1A to 1C will be described with reference to FIGS. 3A to 3E.

Figure 3A:
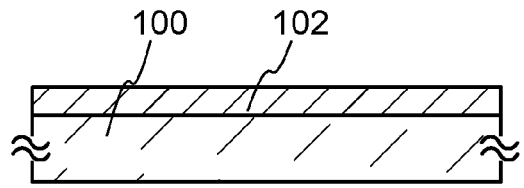
FIGS. 3A to 3E are cross-sectional views illustrating an example of a manufacturing process of a semiconductor device according to one embodiment of the present invention.

First, the base insulating layer 102 is formed over the substrate 100 (see FIG. 3A). The base insulating layer 102 has a thickness in which capacitance per unit area is lower than or equal to $2\times10^{-4}$ F/m$^2$ by capacitance.

There is no particular limitation on the property of a material and the like of the substrate 100 as long as the material has heat resistance enough to withstand at least heat treatment to be performed later. For example, a glass substrate, a ceramic substrate, a quartz substrate, a sapphire substrate, or the like can be used as the substrate 100. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 100. Still alternatively, any of these substrates further provided with a semiconductor element may be used as the substrate 100.

A flexible substrate may be used as the substrate 100. In that case, a transistor is formed directly on the flexible substrate. Note that as a method for forming a transistor over a flexible substrate, there is also a method in which, after a non-flexible substrate is used as the substrate 100 and a transistor is formed thereover, the transistor is separated from the substrate and transferred to a flexible substrate. In that case, a separation layer is preferably provided between the substrate 100 and the transistor.

As a formation method of the base insulating layer 102, a plasma CVD method or a sputtering method can be employed, for example. As a material of the base insulating layer 102, silicon oxide, silicon oxynitride, or the like may be used. Alternatively, the base insulating layer 102 may be formed using a stacked layer of the above material and silicon nitride, silicon nitride oxide, aluminum oxide, aluminum nitride, a mixed material of any of them, or the like. In the case where the base insulating layer 102 is formed to have a stacked-layer structure, an oxide layer of silicon oxide, silicon oxynitride, or the like is preferably formed on a side where the base insulating layer 102 is in contact with the oxide semiconductor layer 106. The total thickness of the base insulating layer 102 is preferably 200 nm or more, more preferably 300 nm or more. When the thick base insulating layer 102 is formed, the physical distance from the interface between the substrate 100 and the base insulating layer 102 to the oxide semiconductor layer serving as a channel region is increased; thus, the adverse effect of charge at the interface between the substrate 100 and the base insulating layer 102 can be reduced.

For example, a silicon oxide film is formed by an RF sputtering method under the following conditions: quartz (preferably synthetic quartz) is used as a target; the substrate temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is higher than or equal to 0.1 Pa and lower than or equal to 4 Pa (preferably higher than or equal to 0.2 Pa and lower than or equal to 1.2 Pa), the high-frequency power is higher than or equal to 0.5 kW and lower than or equal to 12 kW (preferably higher than or equal to 1 kW and lower than or equal to 5 kW); and the proportion of $O_2/(O_2+Ar)$ in the film formation gas is higher than or equal to 1% and lower than or equal to 100% (preferably higher than or equal to 6% and lower than or equal to 100%). Note that a silicon target may be used as the target instead of the quartz (preferably synthetic quartz) target. As the film formation gas, oxygen or a mixed gas of oxygen and argon is used.

Figure 3B:
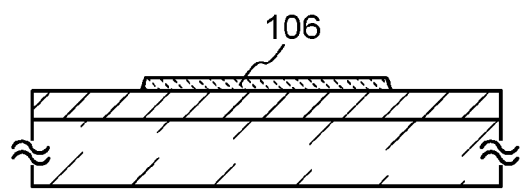

Next, an oxide semiconductor layer is formed over the base insulating layer 102 and then is processed to form the oxide semiconductor layer 106 having an island shape (see FIG. 3B).

For example, the oxide semiconductor layer can be formed by a sputtering method, a vacuum evaporation method, a pulse laser deposition method, a CVD method, or the like. The thickness of the oxide semiconductor layer is preferably greater than or equal to 3 nm and less than or equal to 50 nm. This is because when the oxide semiconductor layer is too thick (e.g., 100 nm or more), there is a possibility that the short channel effect has a large influence and the transistor with a small size is normally on. Here, "normally on" means a state where a channel exists without applying voltage to a gate electrode and current flows through the transistor. Note that the base insulating layer 102 and the oxide semiconductor layer are preferably formed successively without exposure to the air.

For example, the oxide semiconductor layer is formed by a sputtering method using an In—Ga—Zn—O-based oxide target.

As the In—Ga—Zn—O-based oxide target, for example, an oxide target having a composition ratio of $In_2O_3:Ga_2O_3:ZnO=1:1:1$ [molar ratio] can be used. Note that it is not necessary to limit the material and the composition ratio of the target to the above. For example, an oxide target having a composition ratio of $In_2O_3:Ga_2O_3:ZnO=1:1:2$ [molar ratio] can be used.

The relative density of the metal oxide target is higher than or equal to 90% and lower than or equal to 100%, preferably higher than or equal to 95% and lower than or equal to 99.9%. This is because, with the use of the oxide target with a high relative density, the dense oxide semiconductor layer can be formed.

The film formation may be performed in a rare gas atmosphere, an oxygen atmosphere, a mixed atmosphere containing a rare gas and oxygen, or the like. Moreover, it is preferably an atmosphere using a high-purity gas in which impurities such as hydrogen, water, a hydroxyl group, and hydride are sufficiently removed so that entry of hydrogen, water, a hydroxyl group, and hydride into the oxide semiconductor layer can be prevented.

For example, the oxide semiconductor layer can be formed as follows.

An example of the film formation conditions is as follows: the distance between the substrate and the target is 60 mm; the pressure is 0.4 Pa; the direct-current (DC) power is 0.5 kW; and the film formation atmosphere is a mixed atmosphere containing argon and oxygen (the proportion of the oxygen flow is 33%). Note that a pulse DC sputtering method is preferable because powder substances (also referred to as particles or dust) generated in film formation can be reduced and the film thickness can be uniform.

In this case, when the substrate temperature is higher than or equal to 100° C. and lower than or equal to 450° C., preferably higher than or equal to 150° C. and lower than or equal to 250° C., an interface state between the base insulating layer 102 and the oxide semiconductor layer can be reduced.

Note that before the oxide semiconductor layer 106 is formed by a sputtering method, a substance attached to a surface where the oxide semiconductor layer is to be formed (e.g., a surface of the base insulating layer 102) may be removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface side in an argon atmosphere so that plasma is generated near an object to be processed. Note that an atmosphere of nitrogen, helium, oxygen, or the like may be used instead of an argon atmosphere.

The oxide semiconductor layer 106 can be processed by etching after a mask having a desired shape is formed over the oxide semiconductor layer. The mask can be formed by a method such as photolithography. Alternatively, the mask may be formed by an ink jet method or the like.

For the etching of the oxide semiconductor layer, either wet etching or dry etching may be employed. It is needless to say that both of them may be employed in combination.

After that, heat treatment (first heat treatment) is preferably performed on the oxide semiconductor layer. By the first heat treatment, excessive hydrogen (including water and a hydroxyl group) in the oxide semiconductor layer can be removed and a structure of the oxide semiconductor layer can be ordered. The temperature of the first heat treatment is higher than or equal to 100° C. and lower than or equal to 650° C. or lower than the strain point of the substrate, preferably higher than or equal to 250° C. and lower than or equal to 600° C. The atmosphere of the first heat treatment is an oxidizing gas atmosphere or an inert gas atmosphere.

Note that an inert gas atmosphere is preferably an atmosphere that contains nitrogen or a rare gas as its main component and does not contain water, hydrogen, and the like. For example, the purity of nitrogen or a rare gas such as helium, neon, or argon introduced into a heat treatment apparatus is set to 6N (99.9999%) or more, preferably 7N (99.99999%) or more (i.e., the impurity concentration is 1 ppm or lower, preferably 0.1 ppm or lower). The inert gas atmosphere is an atmosphere that contains an inert gas as its main component and contains a reactive gas of 10 ppm or lower.

Note that the oxidizing gas is oxygen, ozone, nitrous oxide, or the like, and it is preferable that the oxidizing gas does not contain water, hydrogen, and the like. For example, the purity of oxygen, ozone, or nitrous oxide introduced into a heat treatment apparatus is set to 6N (99.9999%) or higher, preferably 7N (99.99999%) or higher (i.e., the impurity concentration is 1 ppm or lower, preferably 0.1 ppm or lower). As the oxidizing gas atmosphere, an atmosphere in which an oxidizing gas is mixed with an inert gas may be used, and the oxidizing gas is contained at least at 10 ppm in the atmosphere.

By the first heat treatment, the interface state between the base insulating layer 102 and the oxide semiconductor layer 106 can be reduced. By the above reduction in the interface state, the fluctuation in threshold voltage before and after a BT test can be reduced.

The heat treatment can be performed in such a manner that, for example, an object to be processed is introduced into an electric furnace in which a resistance heating element or the like is used and heated at 350° C. in a nitrogen atmosphere for an hour. During the heat treatment, the oxide semiconductor layer is not exposed to the air to prevent the entry of water and hydrogen.

Note that a heat treatment apparatus is not limited to an electric furnace, and may include a device for heating an object to be processed by heat conduction or heat radiation from a medium such as a heated gas. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (electromagnetic waves) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high temperature gas. As the high temperature gas, used is an inert gas which does not react with an object to be processed in heat treatment, such as nitrogen or a rare gas like argon.

For example, as the first heat treatment, GRTA treatment may be performed as follows. The object to be processed is put in an inert gas atmosphere that has been heated, heated for several minutes, and then taken out of the inert gas atmosphere. GRTA treatment enables high-temperature heat treatment in a short time. Moreover, GRTA treatment can be employed even when the temperature exceeds the upper temperature limit of the object. Note that the inert gas atmosphere may be switched to an atmosphere containing an oxidizing gas during the treatment. This is because by performing the first heat treatment in an atmosphere containing the oxidizing gas, oxygen deficiency in the oxide semiconductor layer 106 can be embedded and defect levels in an energy gap due to oxygen deficiency can be reduced.

The above heat treatment (first heat treatment) can be referred to as dehydration treatment, dehydrogenation treatment, or the like because of its advantageous effect of removing hydrogen, water, and the like. The dehydration treatment or dehydrogenation treatment can be performed at the timing, for example, after the oxide semiconductor layer is processed to have an island shape. Such dehydration treatment or dehydrogenation treatment may be performed once or plural times.

Note that the case is described here in which after the oxide semiconductor layer 106 is processed to have an island shape, the first heat treatment is performed; however, one embodiment of the present invention is not limited thereto. The oxide semiconductor layer 106 may be processed after the first heat treatment.

Figure 3C:
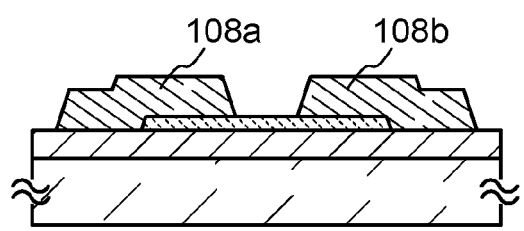

Next, a conductive layer for forming the source electrode and the drain electrode (including a wiring formed in the same layer as the source electrode and the drain electrode) is formed over the base insulating layer 102 and the oxide semiconductor layer 106 and processed to form the source electrode 108a and the drain electrode 108b (see FIG. 3C). The channel length L of the transistor depends on the minimum distance between the edges of the source electrode 108a and the drain electrode 108b which are formed here.

As the conductive layer used for the source electrode 108a and the drain electrode 108b, for example, a metal layer containing an element selected from Al, Cr, Cu, Ta, Ti, Mo, and W, or a metal nitride layer containing any of the above elements as its component (e.g., a titanium nitride layer, a molybdenum nitride layer, or a tungsten nitride layer) can be used. A high-melting-point metal layer of Ti, Mo, W, or the like or a metal nitride layer of any of these elements (a titanium nitride layer, a molybdenum nitride layer, or a tungsten nitride layer) may be stacked on one of or both a bottom side and a top side of a low-melting point and low-resistance metal layer of Al, Cu, or the like.

Alternatively, the conductive layer used for the source electrode 108a and the drain electrode 108b may be formed using a conductive metal oxide. As the conductive metal oxide, an indium oxide ($In_2O_3$ or the like), a tin oxide ($SnO_2$ or the like), a zinc oxide (ZnO or the like), an indium oxide-tin oxide alloy ($In_2O_3$—$SnO_2$ or the like, which is abbreviated to ITO), an indium oxide-zinc oxide alloy ($In_2O_3$—ZnO or the like), or any of these metal oxide materials containing a silicon oxide can be used.

The conductive layer can be processed by etching with the use of a resist mask. Ultraviolet, a KrF laser light, an ArF laser light, or the like is preferably used for light exposure for forming a resist mask for the etching.

In the case where light exposure is performed so that the channel length L is less than 25 nm, the light exposure at the time of forming the resist mask is preferably performed using, for example, extreme ultraviolet having an extremely short wavelength of several nanometers to several tens of nanometers. In the light exposure using extreme ultraviolet, the resolution is high and the focus depth is large. Thus, the channel length L of the transistor formed later can be reduced, whereby the operation speed of a circuit can be increased.

Etching may be performed with the use of a resist mask formed using a so-called multi-tone mask. A resist mask formed using a multi-tone mask has a plurality of thicknesses and can be further changed in shape by ashing; thus, such a resist mask can be used in a plurality of etching steps for different patterns. Therefore, a resist mask for at least two kinds of patterns can be formed using a multi-tone mask, resulting in simplification of the process.

Note that in etching of the conductive layer, part of the oxide semiconductor layer 106 is etched, so that the oxide semiconductor layer having a groove (a recessed portion) is formed in some cases.

After that, by plasma treatment using a gas such as oxygen, ozone, or nitrous oxide, a surface of an exposed portion of the oxide semiconductor layer 106 may be oxidized and oxygen deficiency may be embedded. In the case where plasma treatment is performed, the gate insulating layer 112 which is to be in contact with part of the oxide semiconductor layer 106 is preferably formed without being exposed to the air, following the plasma treatment.

Figure 3D:
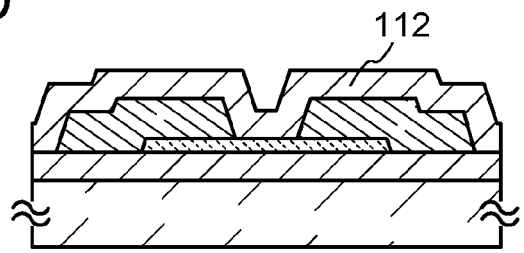

Next, the gate insulating layer 112 is formed so as to cover the source electrode 108a and the drain electrode 108b and to be in contact with part of the oxide semiconductor layer 106 (see FIG. 3D).

The gate insulating layer 112 can have a structure similar to that of the base insulating layer 102. Note that a material having a high dielectric constant, such as hafnium oxide or aluminum oxide, may be used for the gate insulating layer 112 considering the function of the gate insulating layer of the transistor. Alternatively, a stacked layer of silicon oxide, silicon oxynitride, or silicon nitride and a material having a high dielectric constant, such as hafnium oxide or aluminum oxide, may be used considering a gate withstand voltage and a condition of an interface between with the oxide semiconductor layer and the gate insulating layer 112. The total thickness of the gate insulating layer 112 is preferably greater than or equal to 1 nm and less than or equal to 300 nm, more preferably greater than or equal to 5 nm and less than or equal to 50 nm. The larger the thickness of the gate insulating layer is, the more easily a short channel effect occurs; thus, the threshold voltage tends to shift to a negative direction. In addition, it is found that when the thickness of the gate insulating layer is less than or equal to 5 nm, leakage due to a tunnel current is increased.

Second heat treatment is preferably performed after the gate insulating layer 112 is formed. The second heat treatment is performed at a temperature of higher than or equal to 250° C. and lower than or equal to 700° C., preferably higher than or equal to 350° C. and lower than or equal to 600° C. or lower than the strain point of the substrate.

The second heat treatment may be performed in an atmosphere of an oxidizing gas or an inert gas. Note that it is preferable that water, hydrogen, and the like be not contained in the atmosphere of an oxidizing gas or an inert gas. Further, the purity of the gas introduced into a heat treatment apparatus is preferably 6N (99.9999%) or higher, more preferably 7N (99.99999%) or higher (that is, the impurity concentration is 1 ppm or lower, preferably 0.1 ppm or lower).

By the second heat treatment, an interface state between the oxide semiconductor layer and the gate insulating layer 112 can be reduced. At the same time, defects in the gate insulating layer 112 can also be reduced.

Note that there is no particular limitation on the timing of the second heat treatment as long as it is after the gate insulating layer 112 is formed. For example, the second heat treatment may be performed after the gate electrode 114 is formed.

Figure 3E:
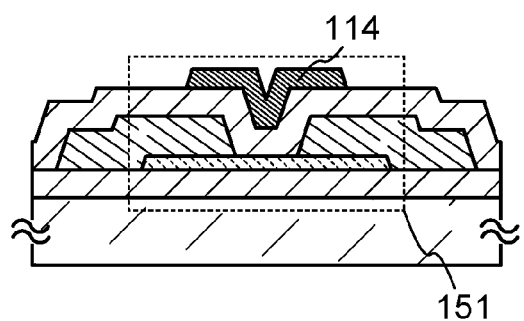

Then, the gate electrode 114 is formed (see FIG. 3E). The gate electrode 114 can be formed using a metal material such as molybdenum, titanium, tantalum, tungsten, aluminum, copper, neodymium, or scandium, nitride of any of these metal materials, or an alloy material which contains any of these metal materials as its main component. Note that the gate electrode 114 may have a single-layer structure or a stacked-layer structure.

Through the above process, the transistor 151 is formed.

Next, an example of a manufacturing process of the transistor 152 in FIG. 2A will be described with reference to FIGS. 4A to 4E.

Figure 4A:
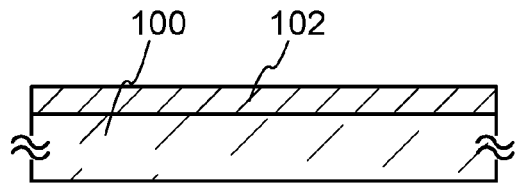
FIGS. 4A to 4E are cross-sectional views illustrating an example of a manufacturing process of a semiconductor device according to one embodiment of the present invention.

First, the base insulating layer 102 is formed over the substrate 100 (see FIG. 4A). The base insulating layer 102 is similar to that in the transistor 151 in that it has a thickness in which a capacitance per unit area is lower than or equal to $2 \times 10^{-4}$ F/m$^2$, preferably lower than or equal to $1.5 \times 10^{-4}$ F/m$^2$ by capacitance.

Figure 4B:
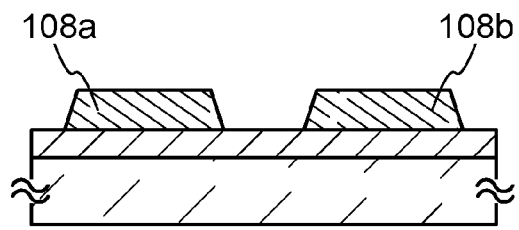

Next, a conductive layer for forming the source electrode and the drain electrode (including a wiring formed in the same layer as the source electrode and the drain electrode) is formed over the base insulating layer 102 and processed to form the source electrode 108a and the drain electrode 108b (see FIG. 4B).

Figure 4C:
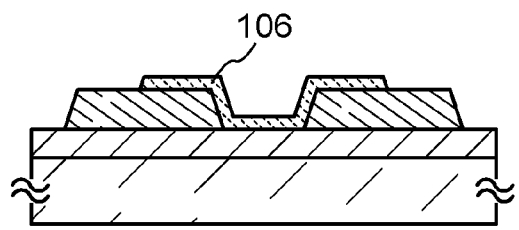

Next, an oxide semiconductor layer is formed over the base insulating layer 102 so as to be connected to the source electrode 108a and the drain electrode 108b and then is processed to form the oxide semiconductor layer 106 having an island shape (see FIG. 4C). After that, first heat treatment similar to that performed on the transistor 151 may be performed.

Figure 4D:
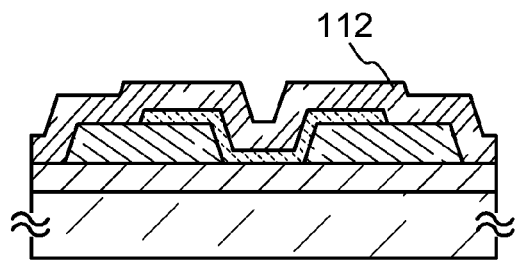

Next, the gate insulating layer 112 is formed so as to be in contact with the oxide semiconductor layer 106 and part of the source electrode 108a and the drain electrode 108b and cover the source electrode 108a, the drain electrode 108b, and the oxide semiconductor layer 106 (see FIG. 4D). After that, second heat treatment similar to that performed on the transistor 151 may be performed.

Figure 4E:
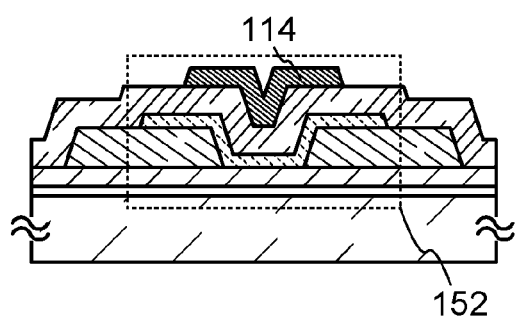

Then, the gate electrode 114 is formed (see FIG. 4E).

Through the above-described process, the transistor 152 is formed.

When charge is trapped at the interface between the substrate and the base insulating layer, the threshold voltage of the transistor shifts. For example, when positive charge is trapped, the threshold voltage of the transistor shifts in a negative direction. As one of factors of such charge trapping, the model where cations (or atoms which are sources of the cations) travel and are trapped can be supposed. In one embodiment of the present invention, the base insulating layer in which a capacitance per unit area is lower than or equal to $2 \times 10^{-4}$ F/m$^2$, preferably lower than or equal to $1.5 \times 10^{-4}$ F/m$^2$ by capacitance is used, the physical distance between the substrate and the base insulating layer is increased, whereby an adverse effect by an interface between the substrate and the base insulating layer can be reduced and shift in the threshold voltage of the transistor can be prevented.

Next, an example of a manufacturing process of the transistor 153 in FIG. 2B will be described with reference to FIGS. 5A to 5E.

Figure 5A:
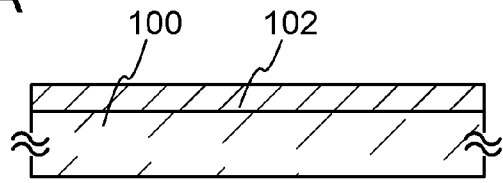
FIGS. 5A to 5E are cross-sectional views illustrating an example of a manufacturing process of a semiconductor device according to one embodiment of the present invention.

First, the base insulating layer 102 is formed over the substrate 100 (see FIG. 5A).

Figure 5B:
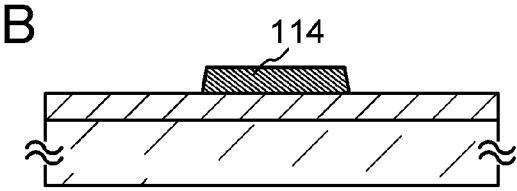

Next, the gate electrode 114 is formed over the base insulating layer 102 (see FIG. 5B).

Figure 5C:
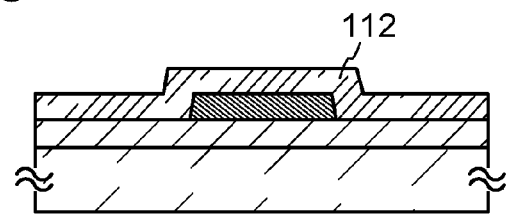
Figure 5D:
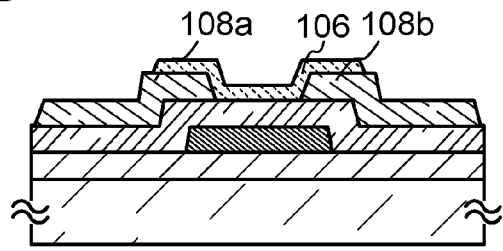

The gate insulating layer 112 is formed over the gate electrode 114 (see FIG. 5C).

The source electrode 108a and the drain electrode 108b are formed over the gate insulating layer 112. An oxide semiconductor layer which is connected to the source electrode 108a and the drain electrode 108b is formed and processed to form an island-shape oxide semiconductor layer 106 (see FIG. 5D). After that, first heat treatment similar to that performed on the transistor 151 may be performed.

Figure 5E:
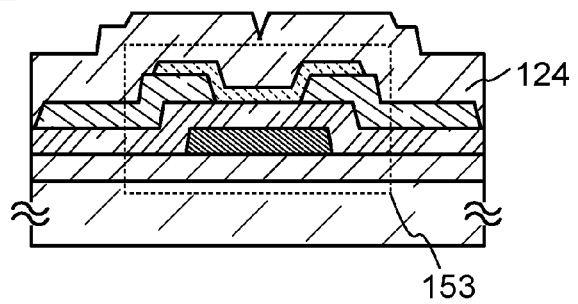

The protective insulating layer 124 is formed to cover the oxide semiconductor layer 106, the source electrode 108a, and the drain electrode 108b (see FIG. 5E). The protective insulating layer is similar to the base insulating layer in the transistor 151 in that it has a thickness in which capacitance per unit area is lower than or equal to $2 \times 10^{-4}$ F/m$^2$, preferably lower than or equal to $1.5 \times 10^{-4}$ F/m$^2$ by capacitance. After that, second heat treatment similar to that performed on the transistor 151 may be performed.

Through the above process, the transistor 153 is formed.

Next, an example of a manufacturing process of the transistor 154 in FIG. 2C will be described with reference to FIGS. 6A to 6E.

Figure 6A:
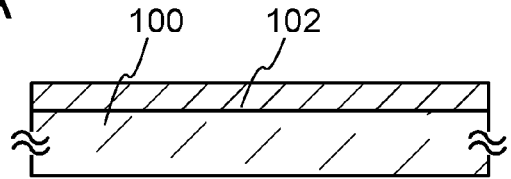
FIGS. 6A to 6E are cross-sectional views illustrating an example of a manufacturing process of a semiconductor device according to one embodiment of the present invention.

First, the base insulating layer 102 is formed over the substrate 100 (see FIG. 6A).

Figure 6B:
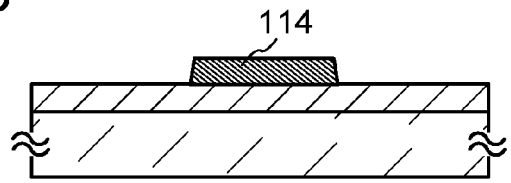

Next, the gate electrode 114 is formed over the base insulating layer 102 (see FIG. 6B).

Figure 6C:
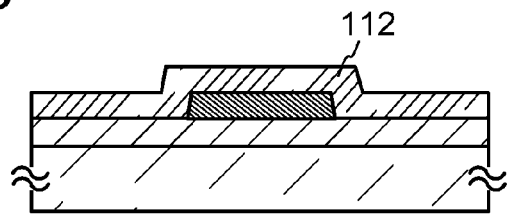
Figure 6D:
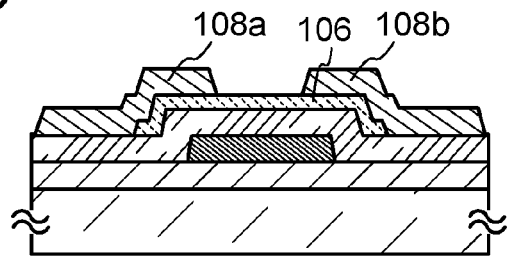

The gate insulating layer 112 is formed over the gate electrode 114 (see FIG. 6C).

An oxide semiconductor layer is formed over the gate insulating layer 112 and processed to form the oxide semiconductor layer 106 having an island shape. First heat treatment similar to that performed on the transistor 151 may be performed. After that, the source and drain electrodes 108a and 108b are formed to be connected to the oxide semiconductor layer 106 (see FIG. 6D).

Figure 6E:
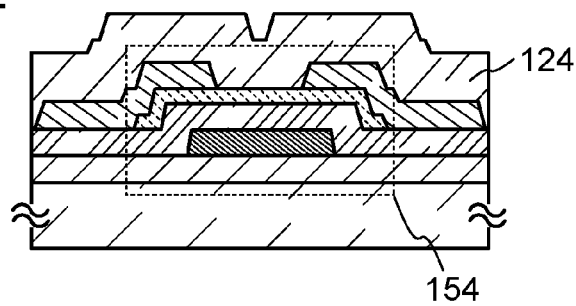

The protective insulating layer 124 is formed to cover the oxide semiconductor layer 106, the source electrode 108a, and the drain electrode 108b (see FIG. 6E). The protective insulating layer has, as the base insulating layer in the transistor 151, a thickness in which capacitance per unit area is lower than or equal to $2 \times 10^{-4}$ F/m$^2$, preferably lower than or equal to $1.5 \times 10^{-4}$ F/m$^2$ by capacitance. After that, the second heat treatment similar to that performed on the transistor 151 may be performed.

Through the above process, the transistor 154 is formed.

An example of a manufacturing process of the transistor 155 in FIG. 2D will be described with reference to FIGS. 7A to 7E.

Figure 7A:
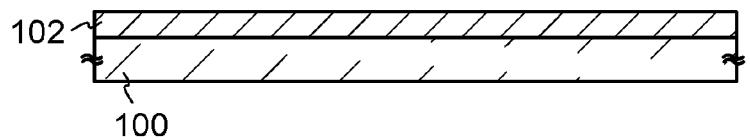
FIGS. 7A to 7E are cross-sectional views illustrating an example of a manufacturing process of a semiconductor device according to one embodiment of the present invention.

First, the base insulating layer 102 is formed over the substrate 100 (see FIG. 7A). The base insulating layer 102 has a thickness in which capacitance per unit area is lower than or equal to $2 \times 10^{-4}$ F/m$^2$, preferably lower than or equal to $1.5 \times 10^{-4}$ F/m$^2$ by capacitance.

Figure 7B:
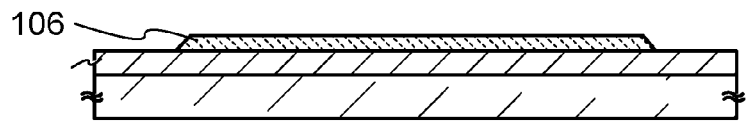

Next, an oxide semiconductor layer is formed over the base insulating layer 102 and processed to form the oxide semiconductor layer 106 having an island shape (see FIG. 7B). After that, first heat treatment similar to that performed on the transistor 151 may be performed.

Figure 7C:
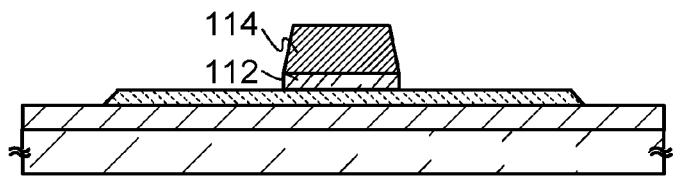
Figure 7D:
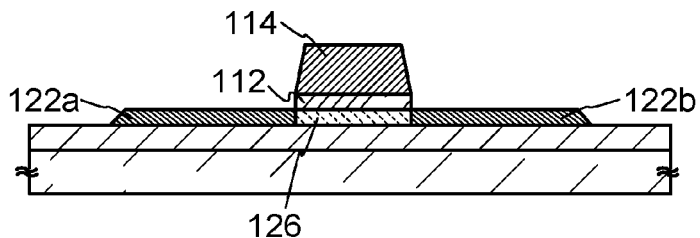
Figure 7E:
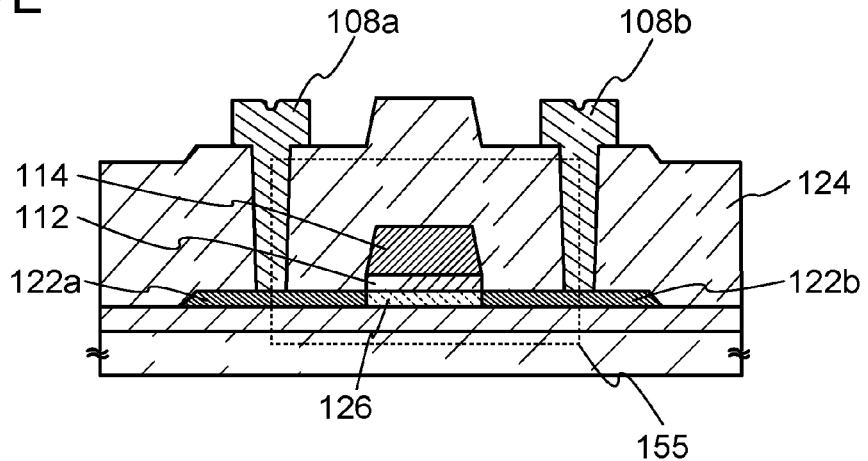

Next, the gate insulating layer 112 and the gate electrode 114 are formed and processed to have similar patterns by photolithography (see FIG. 7C). At this time, the gate electrode 114 may be processed and then the gate insulating layer 112 may be processed using the gate electrode 114 as a mask.

Next, the resistance of the oxide semiconductor layer 106 is reduced using the gate electrode 114 as a mask, so that the source region 122a and the drain region 122b are formed. A region under the gate electrode where the resistance is not reduced becomes the channel region 126 (see FIG. 7D). As a method for reducing the resistance, argon plasma treatment, hydrogen plasma treatment, ammonia plasma treatment, and the like can be given. At this time, the channel length L of the transistor is determined by the width of the gate electrode. By patterning using the gate electrode as the mask in this manner, the source region and the drain region do not overlap with the gate electrode and parasitic capacitance is not generated; therefore, the operation speed of the transistor can be increased.

Next, the protective insulating layer 124 is formed and an opening is provided in a region of the protective insulating layer 124, which is overlapped with the source region 122a and the drain region 122b. A conductive layer for forming the source electrode and the drain electrode (including a wiring formed in the same layer as the source and drain electrodes) is formed and processed to form the source electrode 108a and the drain electrode 108b (see FIG. 7E).

Through the above process, the transistor 155 is formed.

Thus, a semiconductor device including an oxide semiconductor and having stable electrical characteristics can be provided. Therefore, a semiconductor device with high reliability can be provided.

The structures, the methods, and the like described in this embodiment can be combined as appropriate with any of the structures, the methods, and the like described in the other embodiments.

Embodiment 2

A semiconductor device (also referred to as a display device) having a display function can be manufactured using the transistor an example of which is described in Embodiment 1. Some or all driver circuits including the transistors can be formed over a substrate where a pixel portion is formed, whereby a system-on-panel can be obtained.

Figure 8A:
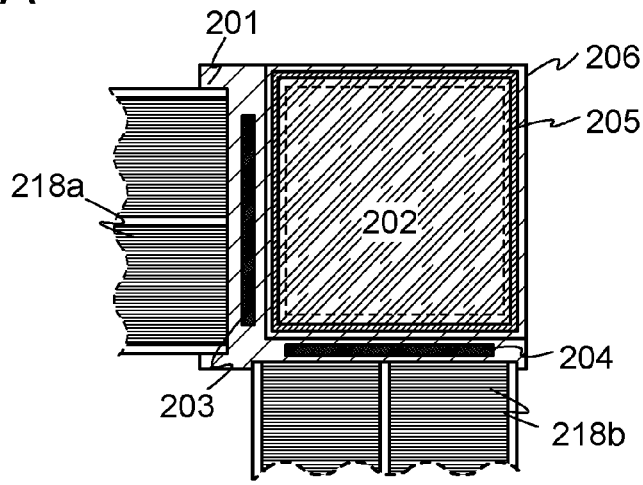
FIGS. 8A to 8C are diagrams each illustrating one mode of a semiconductor device according to one embodiment of the present invention.

In FIG. 8A, a sealant 205 is provided to surround a pixel portion 202 provided over a first substrate 201, and the pixel portion 202 is sealed with the sealant 205 and a second substrate 206. In FIG. 8A, a scan line driver circuit 204 and a signal line driver circuit 203 each are formed using a single crystal semiconductor layer or a polycrystalline semiconductor layer over a substrate prepared separately, and mounted in a region different from the region surrounded by the sealant 205 over the first substrate 201. Various signals and potentials are supplied to the signal line driver circuit 203 and the scan line driver circuit 204 each of which is separately formed, and the pixel portion 202, from flexible printed circuits (FPCs) 218a and 218b.

Figure 8B:
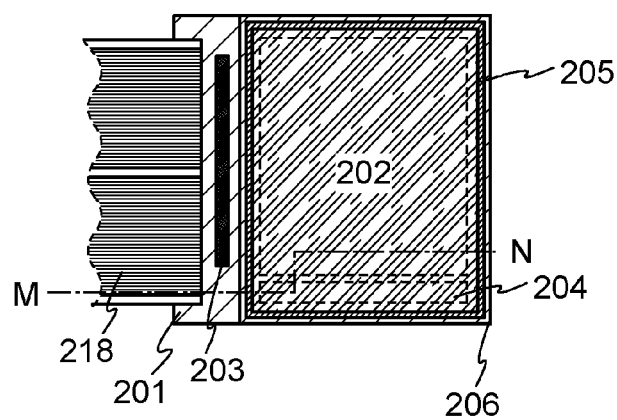
Figure 8C:
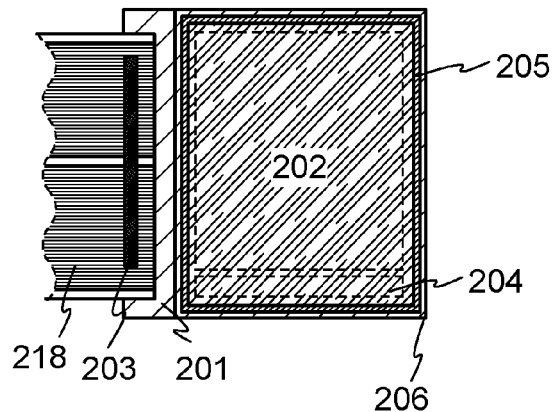

In FIGS. 8B and 8C, the sealant 205 is provided to surround the pixel portion 202 and the scan line driver circuit 204 which are provided over the first substrate 201. The second substrate 206 is provided over the pixel portion 202 and the scan line driver circuit 204. Thus, the pixel portion 202 and the scan line driver circuit 204 are sealed together with a display element, by the first substrate 201, the sealant 205, and the second substrate 206. In FIGS. 8B and 8C, the signal line driver circuit 203 is formed using a single crystal semiconductor layer or a polycrystalline semiconductor layer over a substrate prepared separately, and mounted in a region different from the region surrounded by the sealant 205 over the first substrate 201. In FIGS. 8B and 8C, various signals and potentials are supplied to the signal line driver circuit 203 which is separately formed, the scan line driver circuit 204, and the pixel portion 202, from an FPC 218.

Although FIGS. 8B and 8C each show the example in which the signal line driver circuit 203 is formed separately and mounted on the first substrate 201, the present invention is not limited to this structure. The scan line driver circuit may be separately formed and then mounted, or only part of the signal line driver circuit or part of the scan line driver circuit may be separately formed and then mounted.

Note that a method for connecting a separately formed driver circuit is not particularly limited, and a chip on glass (COG) method, a wire bonding method, a tape automated bonding (TAB) method, or the like can be used. FIG. 8A shows an example in which the signal line driver circuit 203 and the scan line driver circuit 204 are mounted by a COG method. FIG. 8B shows an example in which the signal line driver circuit 203 is mounted by a COG method. FIG. 8C shows an example in which the signal line driver circuit 203 is mounted by a TAB method.

The display device includes in its category a panel in which a display element is sealed, and a module in which an IC such as a controller is mounted on the panel.

Note that a display device in this specification means an image display device, a display device, or a light source (including a lighting device). The display device also includes the following modules in its category: a module to which a connector such as an FPC, a TAB tape, or a TCP is attached; a module having a TAB tape or a TCP at the tip of which a printed wiring board is provided; and a module in which an IC is directly mounted on a display element by a COG method.

The pixel portion and the scan line driver circuit provided over the first substrate include a plurality of transistors and any of the transistors, the examples of which are described in Embodiment 1, can be applied.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or voltage, and specifically includes, in its category, an inorganic electroluminescent (EL) element, an organic EL element, and the like. Furthermore, a display medium whose contrast is changed by an electric effect, such as electronic ink, can be used.

Figure 9:
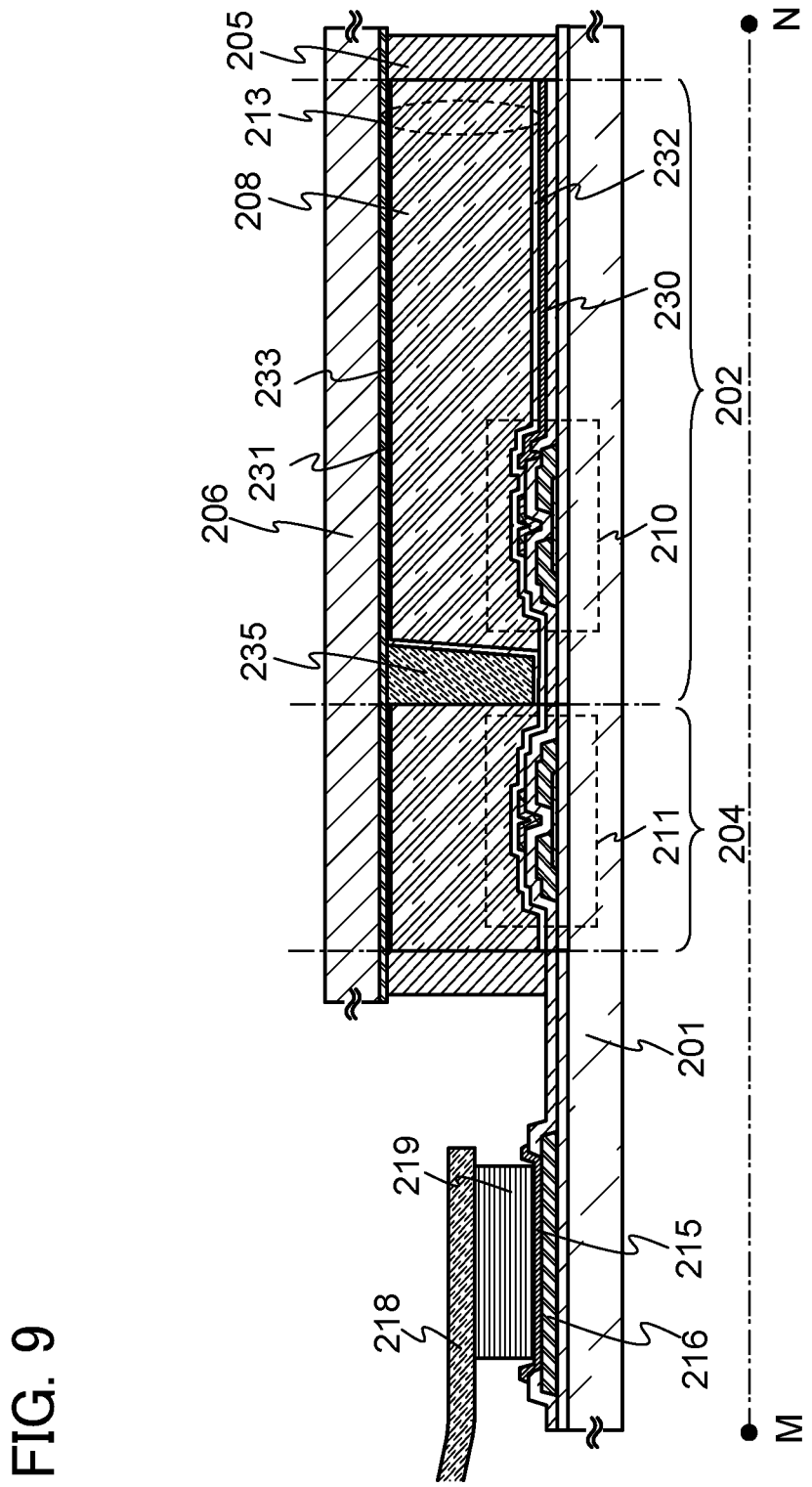
FIG. 9 is a cross-sectional view illustrating one mode of a semiconductor device according to one embodiment of the present invention.
Figure 10:
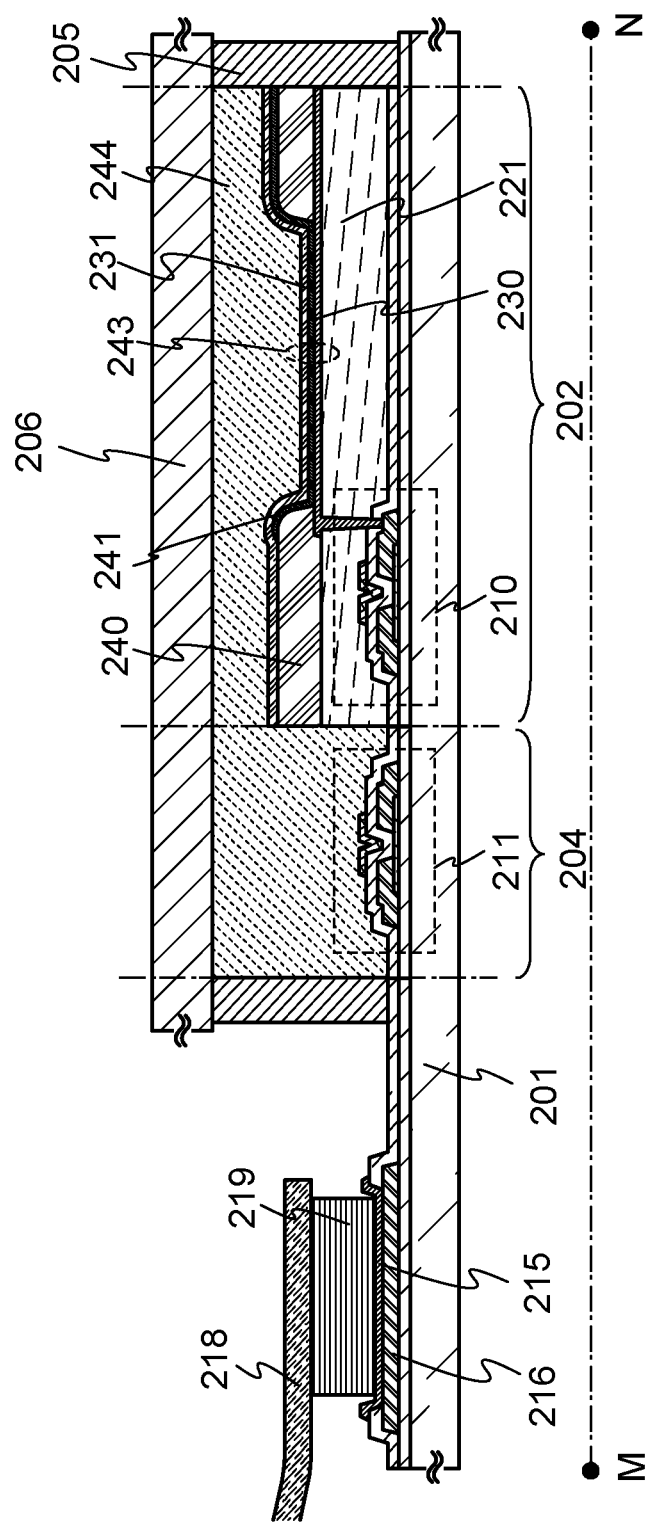
FIG. 10 is a cross-sectional view illustrating one mode of a semiconductor device according to one embodiment of the present invention.
Figure 11:
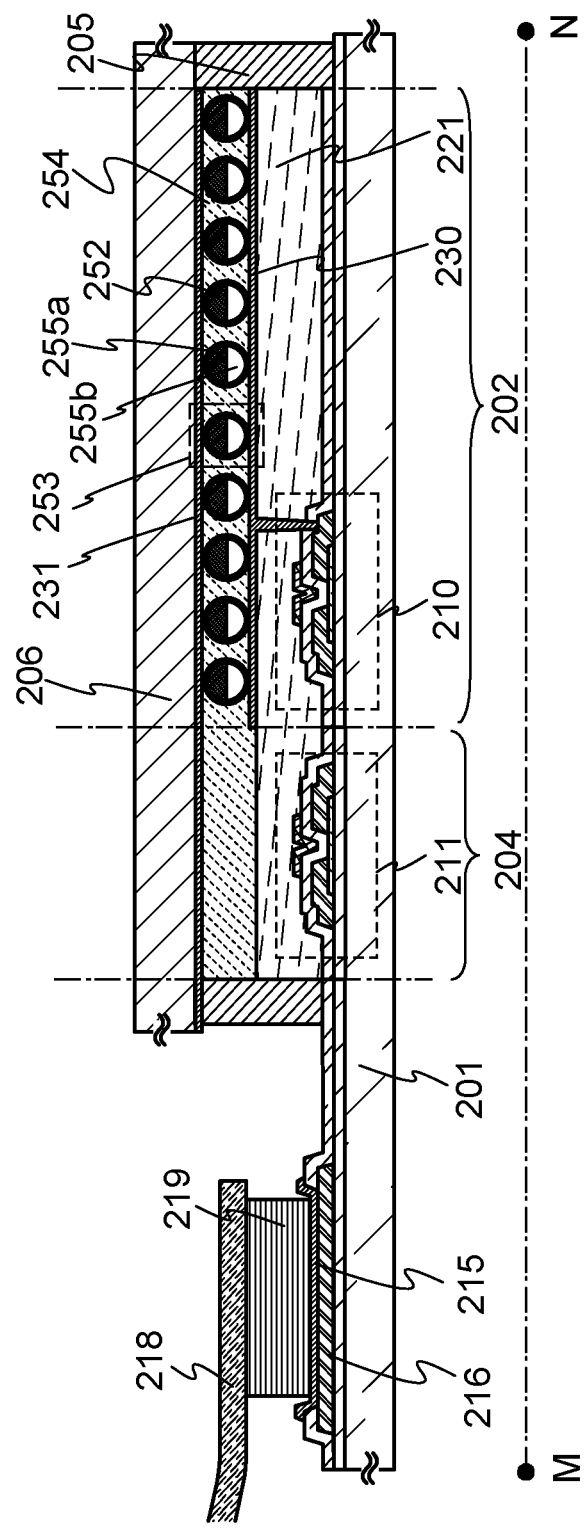
FIG. 11 is a cross-sectional view illustrating one mode of a semiconductor device according to one embodiment of the present invention.

One embodiment of the semiconductor device is described with reference to FIG. 9, FIG. 10, and FIG. 11. FIG. 9, FIG. 10, and FIG. 11 correspond to cross-sectional views taken along line M-N in FIG. 8B.

As illustrated in FIG. 9, FIG. 10, and FIG. 11, the semiconductor device includes a connection terminal electrode 215 and a terminal electrode 216. The connection terminal electrode 215 and the terminal electrode 216 are electrically connected to a terminal included in the FPC 218 through an anisotropic conductive layer 219.

The connection terminal electrode 215 is formed of the same conductive layer as a first electrode layer 230. The terminal electrode 216 is formed of the same conductive layer as a source electrode and a drain electrode of transistors 210 and 211.

Each of the pixel portion 202 and the scan line driver circuit 204 provided over the first substrate 201 includes a plurality of transistors. In FIG. 9, FIG. 10, and FIG. 11, the transistor 210 included in the pixel portion 202 and the transistor 211 included in the scan line driver circuit 204 are shown as an example.

In this embodiment, any of the transistors described in Embodiment 1 can be applied to the transistors 210 and 211. Fluctuation in the electrical characteristics of the transistors 210 and 211 is suppressed and the transistors 210 and 211 are electrically stable. As described above, a semiconductor device with high reliability as the semiconductor devices in this embodiment in FIG. 9, FIG. 10, and FIG. 11 can be obtained.

The transistor 210 provided in the pixel portion 202 is electrically connected to the display element to form a display panel. A variety of display elements can be used as the display element as long as display can be performed.

An example of a liquid crystal display device using a liquid crystal element as a display element is illustrated in FIG. 9. In FIG. 9, a liquid crystal element 213 is a display element including the first electrode layer 230, a second electrode layer 231, and a liquid crystal layer 208. Note that insulating layers 232 and 233 serving as alignment layers are provided so that the liquid crystal layer 208 is interposed therebetween. The second electrode layer 231 is formed on the second substrate 206 side. The first electrode layer 230 and the second electrode layer 231 are stacked with the liquid crystal layer 208 interposed therebetween.

A spacer 235 is a columnar spacer obtained by selective etching of an insulating layer and is provided in order to control the thickness (a cell gap) of the liquid crystal layer 208. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment layer is unnecessary may be used. A blue phase is one of liquid crystal phases generated just before a cholesteric phase changes into an isotropic phase while temperature of cholesteric liquid crystal is increased. Since the blue phase appears only in a narrow temperature range, a liquid crystal composition in which a chiral material is mixed is used for the liquid crystal layer in order to improve the temperature range. The liquid crystal composition which includes a liquid crystal exhibiting a blue phase and a chiral agent has a short response time of 1 msec or less, has optical isotropy, which makes the alignment process unneeded, and has a small viewing angle dependence. In addition, since an alignment layer does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is $1\times10^9$ Ω·cm or more, preferably $1\times10^{11}$ Ω·cm or more, more preferably $1\times10^{12}$ Ω·cm or more. Note that the specific resistivity in this specification is measured at 20° C.

The size of a storage capacitor provided in the liquid crystal display device is set considering the leakage current of the transistor provided in the pixel portion or the like so that charge can be held for a predetermined period. Since the transistor including a high-purity oxide semiconductor layer is used, a storage capacitor having capacitance which is ⅓ or less, preferably ⅕ or less with respect to liquid crystal capacitance of each pixel is sufficient to be provided.

In the transistor used in this embodiment, which uses a highly-purified oxide semiconductor layer, the current in an off state (the off-state current) can be made small. Therefore, an electrical signal such as an image signal can be held for a long period, and a writing interval can be set long when the power is on. Consequently, frequency of refresh operation can be reduced, which leads to an effect of suppressing power consumption.

The field-effect mobility of the transistor including a highly-purified oxide semiconductor layer used in this embodiment can be high, whereby high-speed operation is possible. Thus, by using the transistor in a pixel portion of the liquid crystal display device, a high-quality image can be provided. In addition, by using the transistor, a driver circuit portion and a pixel portion can be separately formed over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is one of methods of controlling alignment of liquid crystal molecules of a liquid crystal display panel. The vertical alignment mode is a mode in which liquid crystal molecules are aligned vertically to a panel surface when voltage is not applied. Some examples are given as the vertical alignment mode. For example, a multi-domain vertical alignment (MVA) mode, a patterned vertical alignment (PVA) mode, an ASV mode, and the like can be given. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

In addition, with the use of a plurality of light-emitting diodes (LEDs) as a backlight, a time-division display method (a field-sequential driving method) can be employed. With the field-sequential driving method, color display can be performed without using a color filter.

As a display method in the pixel portion, a progressive method, an interlace method, or the like can be employed. Color elements controlled in a pixel at the time of color display are not limited to three colors: R, G, and B (R, G, and B correspond to red, green, and blue respectively). For example, R, G, B, and W (W corresponds to white), or R, G, B, and one or more of yellow, cyan, magenta, and the like can be used. The sizes of display regions may be different between respective dots of color elements. Note that the present invention is not limited to the application to a display device for color display but can also be applied to a display device for monochrome display.

Alternatively, as the display element included in the display device, a light-emitting element utilizing an EL element can be used. Light-emitting elements utilizing EL elements are classified depending on whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, such a light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. Then a transistor and a light-emitting element are formed over a substrate. The light-emitting element can have any of the following structure: a top emission structure in which light is extracted through the surface opposite to the substrate; a bottom emission structure in which light is extracted through the surface on the substrate side; or a dual emission structure in which light is extracted through the surface opposite to the substrate and the surface on the substrate side.

An example of a light-emitting device using a light-emitting element as a display element is illustrated in FIG. 10. A light-emitting element 243 which is a display element is electrically connected to the transistor 210 provided in the pixel portion 202. The structure of the light-emitting element 243 is not limited to the stacked-layer structure including the first electrode layer 230, an electroluminescent layer 241, and the second electrode layer 231, which is illustrated in FIG. 10. The structure of the light-emitting element 243 can be changed as appropriate depending on a direction in which light is extracted from the light-emitting element 243, or the like.

A partition wall 240 can be formed using an organic insulating material or an inorganic insulating material. It is particularly preferable that the partition wall 240 be formed using a photosensitive resin material to have an opening portion over the first electrode layer 230 so that a sidewall of the opening portion is formed as a tilted surface with continuous curvature.

The electroluminescent layer 241 may be formed with either a single layer or a stacked layer of a plurality of layers.

A protective layer may be formed over the second electrode layer 231 and the partition wall 240 in order to prevent entry of oxygen, hydrogen, moisture, carbon dioxide, or the like into the light-emitting element 243. As the protective layer, a silicon nitride layer, a silicon nitride oxide layer, a diamond like carbon (DLC) layer, an aluminum oxide layer, an aluminum nitride layer, or the like can be formed. In a space sealed with the first substrate 201, the second substrate 206, and the sealant 205, a filler 244 is provided and tightly sealed. It is preferable that the light-emitting element be packaged (sealed) with a protective film (such as a laminate film or an ultraviolet curable resin film) or a cover material with high air-tightness and little degasification so that the light-emitting element is not exposed to the outside air, in this manner.

As the filler 244, an ultraviolet curable resin or a thermosetting resin can be used as well as an inert gas such as nitrogen or argon, and polyvinyl chloride (PVC), acrylic, polyimide, an epoxy resin, a silicone resin, polyvinyl butyral (PVB), ethylene vinyl acetate (EVA), or the like can be used. For example, nitrogen may be used for the filler.

If needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection layer. For example, anti-glare treatment by which reflected light can be diffused by projections and depressions on the surface so as to reduce the glare can be performed.

An electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display method can be used. The twisting ball display method refers to a method in which spherical particles each colored in white and black are arranged between a first electrode layer and a second electrode layer which are electrode layers used for a display element, and a potential difference is generated between the first electrode layer and the second electrode layer to control orientation of the spherical particles, so that display is performed.

FIG. 11 shows an active matrix electronic paper as one embodiment of a semiconductor device. The electronic paper in FIG. 11 is an example of a display device using a twisting ball display method.

Between the first electrode layer 230 connected to the transistor 210 and the second electrode layer 231 provided on the second substrate 206, spherical particles 253 each of which includes a black region 255a, a white region 255b, and a cavity 252 around the regions which is filled with liquid, are provided. A space around the spherical particles 253 is filled with a filler 254 such as a resin. The second electrode layer 231 corresponds to a common electrode (counter electrode). The second electrode layer 231 is electrically connected to a common potential line.

Note that in FIG. 9, FIG. 10, and FIG. 11, a flexible substrate as well as a glass substrate can be used as the first substrate 201 and the second substrate 206. For example, a plastic substrate having light-transmitting properties can be used. For plastic, a fiberglass-reinforced plastics (FRP) plate, a polyvinyl fluoride (PVF) film, a polyester film, or an acrylic resin film can be used. A sheet with a structure in which an aluminum foil is sandwiched between PVF films or polyester films can also be used.

An insulating layer 221 can be formed using an organic insulating material or an inorganic insulating material. Note that an organic insulating material having heat resistance, such as an acrylic resin, a polyimide, a benzocyclobutene-based resin, a polyamide, or an epoxy resin is preferably used as a planarizing insulating layer. Other than such organic insulating materials, it is possible to use a low-dielectric constant material (a low-k material), a siloxane-based resin, phosphosilicate glass (PSG), borophosphosilicate glass (BPSG), or the like. The insulating layer 221 may be formed by stacking a plurality of insulating layers formed of these materials.

There is no particular limitation on the method for forming the insulating layer 221, and the insulating layer 221 can be formed, depending on a material thereof, by a sputtering method, a spin coating method, a dipping method, a spray coating method, a droplet discharging method (e.g., an ink jet method, a screen printing method, or an offset printing method), a roll coating method, a curtain coating method, a knife coating method, or the like.

The display device performs display by transmitting light from a light source or a display element. Thus, the substrates and the thin films such as insulating layers and conductive layers provided in the pixel portion where light is transmitted have light-transmitting properties with respect to light in the visible-light wavelength range.

The first electrode layer 230 and the second electrode layer 231 (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, and the pattern structure of the electrode layer.

A light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added, can be used for the first electrode layer 230 and the second electrode layer 231.

The first electrode layer 230 and the second electrode layer 231 can be formed using one kind or plural kinds selected from metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also referred to as a conductive polymer) can be used for the first electrode layer 230 and the second electrode layer 231. As the conductive high molecule, a so-called π-electron conjugated conductive polymer can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken due to static electricity or the like, a protective circuit for protecting the driver circuit is preferably provided. The protective circuit is preferably formed using a nonlinear element.

As described above, by using any of the transistors in Embodiment 1, a semiconductor device with high reliability can be provided. Note that the transistors described in Embodiment 1 can be applied to not only semiconductor devices having the display functions described above but also semiconductor devices having a variety of functions, such as a power device which is mounted on a power supply circuit, a semiconductor integrated circuit such as an LSI, and a semiconductor device having an image sensor function of reading information of an object.

The structures, the methods, and the like described in this embodiment can be combined as appropriate with any of the structures, the methods, and the like described in the other embodiments.

Embodiment 3

A semiconductor device which is one embodiment of the present invention can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic appliances each including the semiconductor device described in the above embodiment are described.

Figure 12A:
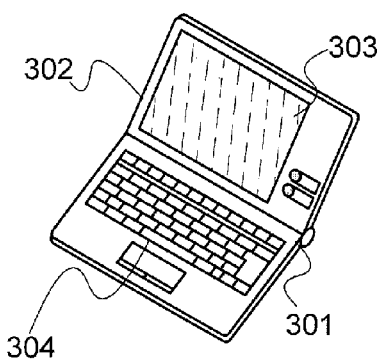
FIGS. 12A to 12F are diagrams each illustrating an electronic appliance as a semiconductor device according to one embodiment of the present invention.

FIG. 12A illustrates a laptop personal computer, which includes a main body 301, a housing 302, a display portion 303, a keyboard 304, and the like. By applying the semiconductor device described in Embodiment 1 or 2, the laptop personal computer can have high reliability.

Figure 12B:
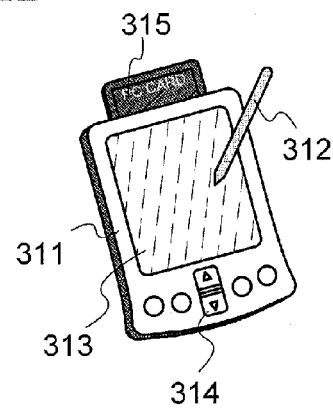

FIG. 12B illustrates a portable information terminal (PDA) which includes a display portion 313, an external interface 315, an operation button 314, and the like in a main body 311. A stylus 312 is included as an accessory for operation. By applying the semiconductor device described in Embodiment 1 or 2, the portable information terminal (PDA) can have higher reliability.

Figure 12C:
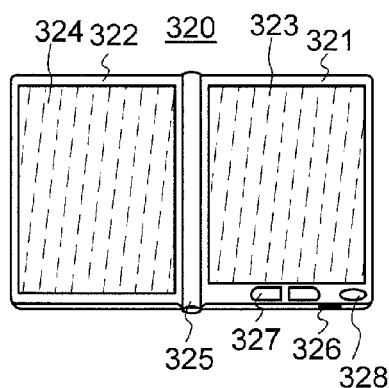

FIG. 12C illustrates an example of an e-book reader. For example, an e-book reader 320 includes two housings, a housing 321 and a housing 322. The housing 321 and the housing 322 are combined with a hinge 325 so that the e-book reader 320 can be opened and closed with the hinge 325 as an axis. With such a structure, the e-book reader 320 can operate like a paper book.

A display portion 323 and a display portion 324 are incorporated in the housing 321 and the housing 322, respectively. The display portion 323 and the display portion 324 may display one image or different images. When the display portion 323 and the display portion 324 display different images, for example, text can be displayed on a display portion on the right side (the display portion 323 in FIG. 12C) and graphics can be displayed on a display portion on the left side (the display portion 324 in FIG. 12C). By applying the semiconductor device described in Embodiment 1 or 2, the e-book reader 320 can have high reliability.

FIG. 12C illustrates an example in which the housing 321 is provided with an operation portion and the like. For example, the housing 321 is provided with a power switch 326, operation keys 327, a speaker 328, and the like. With the operation key 327, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the e-book reader 320 may have a function of an electronic dictionary.

The e-book reader 320 may have a configuration capable of wirelessly transmitting and receiving data. Through wireless communication, desired book data or the like can be purchased and downloaded from an e-book server.

Figure 12D:
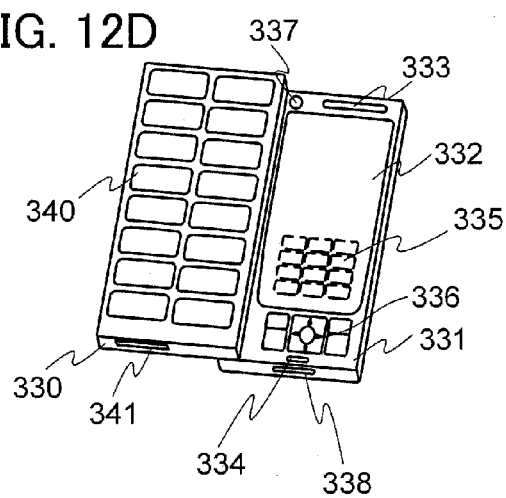

FIG. 12D illustrates a mobile phone, which includes two housings, a housing 330 and a housing 331. The housing 331 includes a display panel 332, a speaker 333, a microphone 334, a pointing device 336, a camera lens 337, an external connection terminal 338, and the like. In addition, the housing 330 includes a solar cell 340 having a function of charge of the portable information terminal, an external memory slot 341, and the like. Further, an antenna is incorporated in the housing 331. By applying the semiconductor device described in Embodiment 1 or 2, the mobile phone can have high reliability.

Further, the display panel 332 is provided with a touch panel. A plurality of operation keys 335 which are displayed as images is illustrated by dashed lines in FIG. 12D. Note that a boosting circuit by which a voltage output from the solar cell 340 is increased to be sufficiently high for each circuit is also included.

In the display panel 332, the display orientation can be changed as appropriate depending on a usage pattern. Further, the mobile phone is provided with the camera lens 337 on the same surface as the display panel 332, and thus it can be used as a video phone. The speaker 333 and the microphone 334 can be used for videophone calls, recording and playing sound, and the like as well as voice calls. Moreover, the housings 330 and 331 in a state where they are opened as illustrated in FIG. 12D can be slid so that one overlaps the other; therefore, the size of the mobile phone can be reduced, which makes the mobile phone suitable for being carried.

The external connection terminal 338 can be connected to an AC adapter and various types of cables such as a USB cable, and charging and data communication with a personal computer are possible. Moreover, a larger amount of data can be saved and moved by inserting a recording medium to the external memory slot 341.

Further, in addition to the above functions, an infrared communication function, a television reception function, or the like may be provided.

Figure 12E:
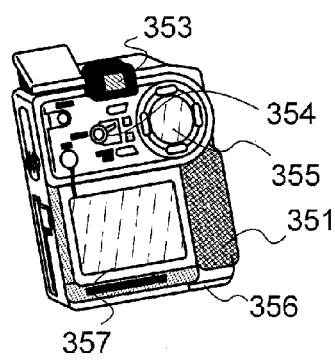

FIG. 12E illustrates a digital video camera which includes a main body 351, a display portion (A) 357, an eyepiece 353, an operation switch 354, a display portion (B) 355, a battery 356, and the like. By applying the semiconductor device described in Embodiment 1 or 2, the digital video camera can have high reliability.

Figure 12F:
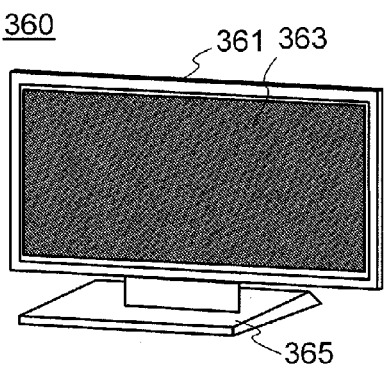

FIG. 12F illustrates an example of a television set. In a television set 360, a display portion 363 is incorporated in a housing 361. The display portion 363 can display images. Here, the housing 361 is supported by a stand 365. By applying the semiconductor device described in Embodiment 1 or 2, the television set 360 can have high reliability.

The television set 360 can be operated by an operation switch of the housing 361 or a separate remote controller. Further, the remote controller may be provided with a display portion for displaying data output from the remote controller.

Note that the television set 360 is provided with a receiver, a modem, and the like. With the use of the receiver, general television broadcasting can be received. Furthermore, when the television set is connected to a communication network with or without wires via the modem, one-way (from a sender to a receiver) or two-way (between a sender and a receiver or between receivers) information communication can be performed.

The structures, the methods, and the like described in this embodiment can be combined as appropriate with any of the structures, the methods, and the like described in the other embodiments.

Example 1

In this example, a transistor formed using one embodiment of the present invention is described.

Figure 13:
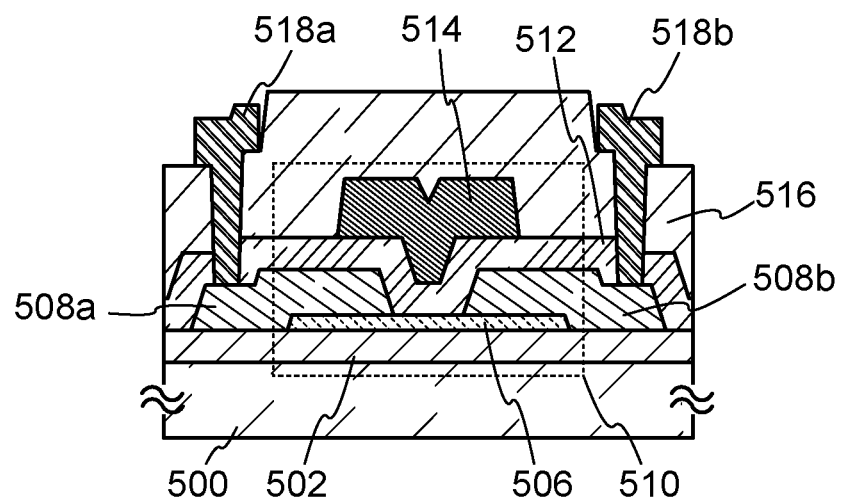
FIG. 13 is a cross-sectional view illustrating an example of a semiconductor device according to one embodiment of the present invention.

FIG. 13 illustrates a structure of the transistor of this example.

The transistor 510 in FIG. 13 includes a base insulating layer 502 provided over a substrate 500, an oxide semiconductor layer 506, a source electrode 508a and a drain electrode 508b, a gate insulating layer 512 provided over the source electrode 508a and the drain electrode 508b, a gate electrode 514 provided over the gate insulating layer 512, a protective insulating layer 516 provided over the gate electrode 514, and a source wiring 518a and a drain wiring 518b connected to the source electrode 508a and the drain electrode 508b, respectively, with the protective insulating layer 516 interposed therebetween.

In this example, a 0.7-mm-thick glass substrate was used as the substrate 500, a 300-nm-thick silicon oxide layer was formed as the base insulating layer 502, a 30-nm-thick In—Ga—Zn—O-based non-single-crystal layer was formed as the oxide semiconductor layer 506, a 100-nm-thick tungsten layer was formed as the source electrode 508a and the drain electrode 508b, a 20-nm-thick silicon oxynitride layer was formed as the gate insulating layer 512, a stack of a 30-nm-thick tantalum nitride layer and a 370-nm-thick tungsten layer was formed as the gate electrode 514, a 300-nm-thick silicon oxide layer was formed as the protective insulating layer 516, and a stack of a 50-nm-thick titanium layer, a 100-nm-thick aluminum layer, and a 5-nm-thick titanium layer was formed as the source wiring 518a and the drain wiring 518b.

In the transistor of this example, a 300-nm-thick silicon oxide layer was used as the base insulating layer 502, whereby fluctuation in the threshold voltage and fluctuation in the threshold voltage after a BT test were reduced. When the 300-nm-thick silicon oxide layer formed in this example was sandwiched between electrodes and capacitance thereof was measured, capacitance per unit area was $1.3 \times 10^{-4}$ F/m$^2$.

Other formation conditions of the silicon oxide layer were as follows.
Film formation method: RF sputtering method
Target: synthesized quartz target
Film formation gas: Ar (25 sccm), O$_2$ (25 sccm)
Electric power: 1.5 kW (13.56 MHz)
Pressure: 0.4 Pa
T-S distance: 60 mm
Substrate temperature: 100° C.

The formation conditions of the oxide semiconductor layer 506 in the transistor of this example were as follows.
Film formation method: DC sputtering method
Target: In—Ga—Zn—O (In$_2$O$_3$:Ga$_2$O$_3$:ZnO=1:1:2 [molar ratio]) target
Film formation gas: Ar (30 sccm), O$_2$ (15 sccm)
Electric power: 0.5 kW (DC)
Pressure: 0.4 Pa
T-S distance: 60 mm
Substrate temperature: 200° C.

After the oxide semiconductor layer 506 was formed, heat treatment was performed at 350° C. in a nitrogen atmosphere for an hour using a resistance heating furnace.

Figure 14:
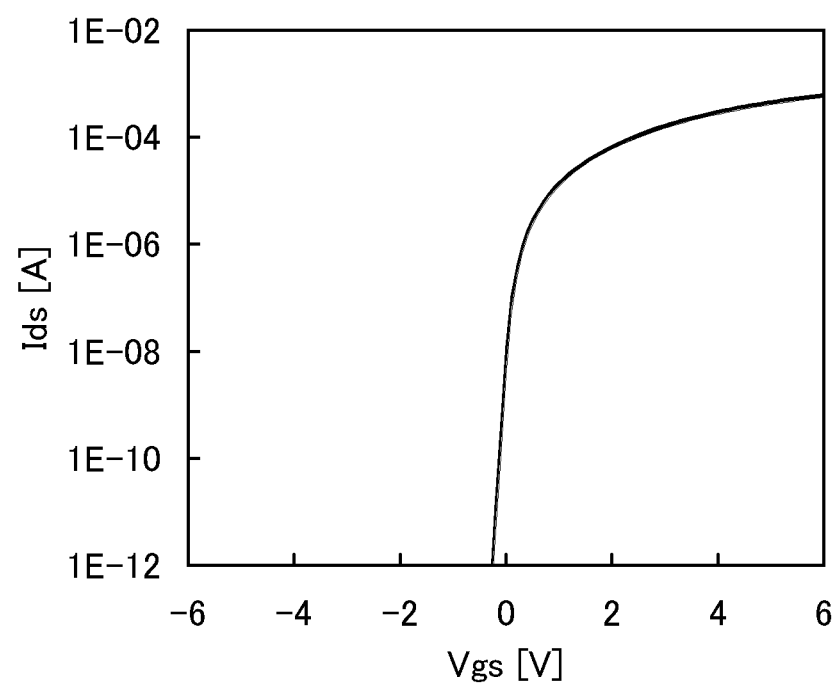
FIG. 14 is a graph showing a semiconductor device manufactured using one embodiment of the present invention.

FIG. 14 shows drain current (Ids)-gate voltage (Vgs) measurement results in the transistor of this example. The measurement was performed at 25 points on a substrate surface. The measurement results at the 25 points are shown in FIG. 14 together. The channel length L is 2 μm, and the channel width W is 50 μm. Note that the voltage Vds between the source electrode and the drain electrode of the transistor was set to 3 V.

According to FIG. 14, it was found that there was no variation in the substrate surface of the transistor of this example. Note that the average threshold voltage of the 25 points was 0.27 V.

Next, the BT test in this example is described. The transistor on which the BT test is performed has a channel length L of 3 μm and a channel width W of 50 μm. In this example, first, the substrate temperature was set to 25° C. and the voltage Vds of the source electrode and the drain electrode was set to 3 V to perform the Ids-Vgs measurement of the transistor.

Figure 15A:
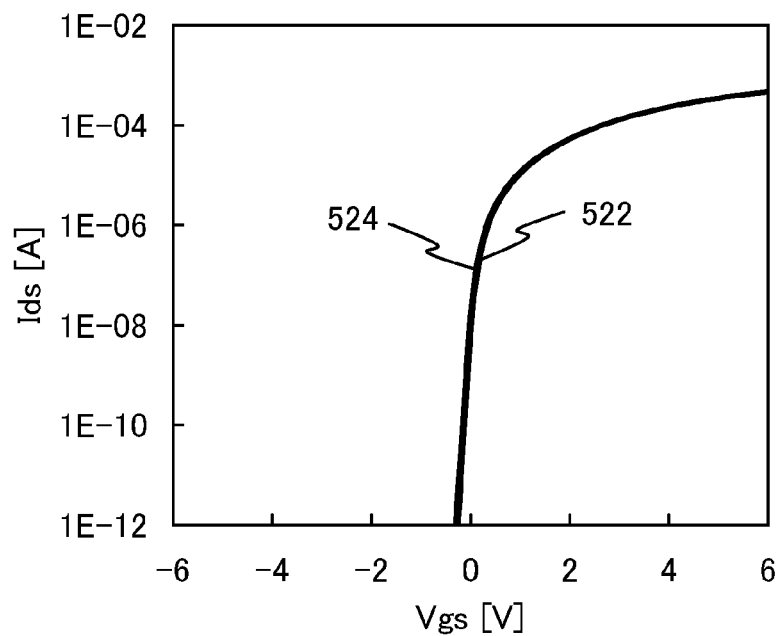
FIGS. 15A and 15B are graphs each showing a semiconductor device manufactured using one embodiment of the present invention.

Next, the substrate stage temperature was set to 150° C., and the source electrode and the drain electrode of the transistor were set to 0 V and 0.1 V, respectively. Then, a negative voltage was applied to the gate electrode so that electric-field intensity applied to the gate insulating layer was 2 MV/cm, and the above conditions were kept for an hour. Next, the voltage of the gate electrode was set to 0 V. After that, the substrate temperature was set to 25° C. and the voltage Vds of the source electrode and the drain electrode was set to 3 V to perform the Ids-Vgs measurement of the transistor. FIG. 15A shows the Ids-Vgs measurement results before and after the BT test.

In FIG. 15A, a thin line 522 shows the Ids-Vgs measurement results before the BT test, and a thick line 524 shows the Ids-Vgs measurement results after the BT test. It is found that the threshold voltage fluctuates in a negative direction by 0.07 V after the BT test, as compared to the measurement results before the BT test.

In a similar manner, another transistor for measurement was prepared, and the substrate temperature was set to 25° C. and the voltage Vds of the source electrode and the drain electrode was set to 3 V to perform the Ids-Vgs measurement of the transistor. The channel length L of the transistor is 3 μm, and the channel width W thereof is 50 μm.

Figure 15B:
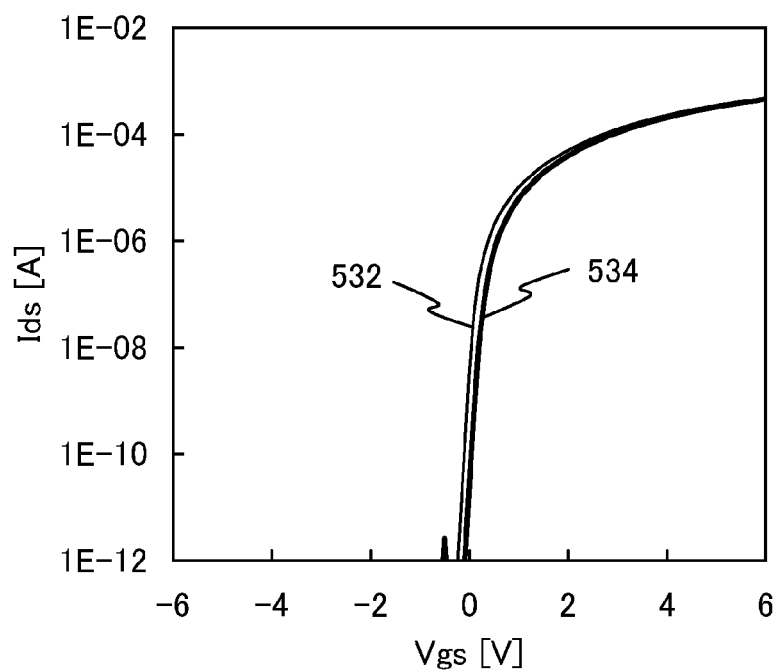

Next, the substrate stage temperature was set to 150° C., and the source electrode and the drain electrode of the transistor were set to 0 V and 0.1 V, respectively. Then, a positive voltage was applied to the gate electrode so that electric-field intensity applied to the gate insulating layer was 2 MV/cm, and the above conditions were kept for an hour. Next, the voltage of the gate electrode was set to 0 V. After that, the substrate temperature was set to 25° C. and the voltage Vds of the source electrode and the drain electrode was set to 3 V to perform the Ids-Vgs measurement of the transistor. FIG. 15B shows the Ids-Vgs measurement results before and after the BT test.

In FIG. 15B, a thin line 532 shows the Ids-Vgs measurement results before the BT test, and a thick line 534 shows the Ids-Vgs measurement results after the BT test. It is found that the threshold voltage fluctuates in a positive direction by 0.19 V after the BT test, as compared to the measurement results before the BT test.

As described above, it is found that the transistor of this example has small variation in the threshold voltage of the substrate surface and small fluctuation in the threshold voltage between before and after a BT test.

This application is based on Japanese Patent Application serial no. 2010-117743 filed with Japan Patent Office on May 21, 2010, the entire contents of which are hereby incorporated by reference.

EXPLANATION OF REFERENCE

100: substrate, 102: insulating layer, 106: oxide semiconductor layer, 108a: source electrode, 108b: drain electrode, 112: gate insulating layer, 114: gate electrode, 122a: source region, 122b: drain region, 124: protective insulating layer, 126: channel region, 151: transistor, 152: transistor, 153: transistor, 154: transistor, 155: transistor, 201: first substrate, 202: pixel portion, 203: signal line driver circuit, 204: scan line driver circuit, 205: sealant, 206: second substrate, 208: liquid crystal layer, 210: transistor, 211: transistor, 213: liquid crystal element, 215: connection terminal electrode, 216: terminal electrode, 218: FPC, 218a: FPC, 218b: FPC, 219: anisotropic conductive layer, 221: insulating layer, 230: first electrode layer, 231: second electrode layer, 232: insulating layer, 233: insulating layer, 235: spacer, 240: partition wall, 241: electroluminescent layer, 243: light-emitting element, 244: filler, 252: cavity, 253: spherical particle, 254: filler, 255a: black region, 255b: white region, 301: main body, 302: housing, 303: display portion, 304: keyboard, 311: main body, 312: stylus, 313: display portion, 314: operation button, 315: external interface, 320: e-book reader, 321: housing, 322: housing, 323: display portion, 324: display portion, 325: hinge, 326: power switch, 327: operation key, 328: speaker, 330: housing, 331: housing, 332: display panel, 333: speaker, 334: microphone, 335: operation key, 336: pointing device, 337: camera lens, 338: external connection terminal, 340: solar cell, 341: external memory slot, 351: main body, 353: eyepiece, 354: operation switch, 355: display portion (B), 356: battery, 357: display portion (A), 360: television set, 361: housing, 363: display portion, 365: stand, 500: substrate, 502: insulating layer, 506: oxide semiconductor layer, 508a: source electrode, 508b: drain electrode, 510: transistor, 512: gate insulating layer, 514: gate electrode, 516: protective insulating layer, 518a: source wiring, 518b: drain wiring, 522: thin line, 524: thick line, 532: thin line, and 534: thick line.

The invention claimed is:

1. A method of manufacturing a semiconductor device comprising the steps of:
    forming an insulating layer over a substrate;
    forming an oxide semiconductor layer over and in contact with the insulating layer;
    forming an island shape oxide semiconductor layer by etching the oxide semiconductor layer;
    heating the island shape oxide semiconductor layer in an inert gas in a first period and then in an oxidizing gas in a second period after the first period; and
    forming a gate electrode over the island shape oxide semiconductor layer,
    wherein the insulating layer has a thickness in which capacitance per unit area is lower than or equal to $2 \times 10^{-4}$ F/m$^2$ by capacitance, and
    wherein the oxide semiconductor layer is formed by sputtering with a temperature of the substrate kept 150° C. or higher.

2. The method according to claim 1, wherein the insulating layer comprises one or more of silicon oxide, silicon nitride, silicon oxynitride, silicon nitride oxide, aluminum oxide, and aluminum nitride.

3. The method according to claim 1, wherein the insulating layer comprises multiple layers, wherein one of the multiple layers which is in contact with the oxide semiconductor layer is an oxide layer.

4. The method according to claim 1, wherein the oxide semiconductor layer comprises indium, zinc and gallium.

5. The method according to claim 1, wherein the insulating layer comprises a first layer and a second layer over the first layer, the first layer comprising aluminum oxide, and the second layer comprising silicon oxynitride or silicon oxide.

6. The method according to claim 1, wherein the substrate is a glass substrate.

7. A method of manufacturing a semiconductor device comprising the steps of:
    forming an insulating layer over a substrate;
    forming an oxide semiconductor layer over and in contact with the insulating layer;
    forming an island shape oxide semiconductor layer by etching the oxide semiconductor layer;
    heating the island shape oxide semiconductor layer in an inert gas in a first period and then in an oxidizing gas in a second period after the first period; and
    forming a gate electrode over the island shape oxide semiconductor layer,
    wherein the insulating layer has a thickness in which capacitance per unit area is lower than or equal to $2 \times 10^{-4}$ F/m$^2$ by capacitance.

8. The method according to claim 7, wherein the insulating layer comprises one or more of silicon oxide, silicon nitride, silicon oxynitride, silicon nitride oxide, aluminum oxide, and aluminum nitride.

9. The method according to claim 7, wherein the insulating layer comprises multiple layers, wherein one of the multiple layers which is in contact with the oxide semiconductor layer is an oxide layer.

10. The method according to claim 7, wherein the oxide semiconductor layer comprises indium, zinc and gallium.

11. The method according to claim 7, wherein the insulating layer comprises a first layer and a second layer over the first layer, the first layer comprising aluminum oxide, and the second layer comprising silicon oxynitride or silicon oxide.

12. The method according to claim 7, wherein the substrate is a glass substrate.

* * * * *